(12) United States Patent
Ohkawa et al.

(10) Patent No.: US 9,928,794 B2
(45) Date of Patent: Mar. 27, 2018

(54) SHIFT REGISTER AND DISPLAY APPARATUS

(71) Applicant: Sharp Kabushiki Kaisha, Osaka-shi, Osaka (JP)

(72) Inventors: Hiroyuki Ohkawa, Osaka (JP); Shige Furuta, Osaka (JP); Yuhichiroh Murakami, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 170 days.

(21) Appl. No.: 14/907,008

(22) PCT Filed: Jul. 18, 2014

(86) PCT No.: PCT/JP2014/069138
§ 371 (c)(1),
(2) Date: Jan. 22, 2016

(87) PCT Pub. No.: WO2015/012207
PCT Pub. Date: Jan. 29, 2015

(65) Prior Publication Data
US 2016/0253977 A1    Sep. 1, 2016

(30) Foreign Application Priority Data
Jul. 25, 2013    (JP) .................................. 2013-154634

(51) Int. Cl.
*G11C 19/00*    (2006.01)
*G09G 3/36*    (2006.01)
*G11C 19/28*    (2006.01)

(52) U.S. Cl.
CPC ......... *G09G 3/3677* (2013.01); *G09G 3/3648* (2013.01); *G11C 19/28* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

2010/0141641 A1* 6/2010 Furuta .................. G11C 19/184
345/213
2010/0259525 A1* 10/2010 Ohkawa .................... G09G 3/20
345/211

(Continued)

FOREIGN PATENT DOCUMENTS

WO    2012/029799 A1    3/2012

*Primary Examiner* — Tuan T Lam
(74) *Attorney, Agent, or Firm* — Keating & Bennett, LLP

(57) ABSTRACT

A shift register according to the present invention is a shift register in which a plurality of unit circuits are connected in cascade, wherein the unit circuit includes a first output transistor whose current path is connected between an output terminal and a clock terminal to which a first clock signal is provided; a second output transistor whose current path is connected between the output terminal and a predetermined potential node; a setting device which, when a control signal is active, sets a signal level of the output terminal to a predetermined signal level; a first output control device which provides a signal level of the control signal to a control electrode of the first output transistor to turn off the first output transistor when the control signal is active; and a second output control device which turns off the second output transistor when the control signal is active.

10 Claims, 32 Drawing Sheets

(56) References Cited

U.S. PATENT DOCUMENTS

| | | | | |
|---|---|---|---|---|
| 2013/0155044 A1* | 6/2013 | Ohkawa | ............... | G09G 3/3677 345/211 |
| 2015/0015558 A1* | 1/2015 | Sasaki | .................. | G09G 3/3677 345/211 |
| 2015/0262703 A1* | 9/2015 | Murakami | ............... | G09G 3/20 345/214 |
| 2015/0279480 A1* | 10/2015 | Murakami | ............... | G09G 3/20 345/100 |
| 2015/0279481 A1* | 10/2015 | Sasaki | ................. | G11C 19/184 377/69 |
| 2016/0018844 A1* | 1/2016 | Sasaki | ................... | G11C 19/28 713/600 |
| 2016/0027527 A1* | 1/2016 | Murakami | ........... | G09G 3/3677 377/64 |
| 2016/0240159 A1* | 8/2016 | Ohkawa | ................ | G11C 19/28 |

* cited by examiner

SHIFT REGISTER AND DISPLAY APPARATUS

TECHNICAL FIELD

The present invention relates to a shift register and a display apparatus and specifically relates to the shift register used in a drive circuit of the display apparatus.

This application claims priority from Japanese Patent Application No. 2013-154634, filed in Japan on Jul. 25, 2013; the entire contents of which are incorporated herein by reference.

BACKGROUND ART

Recently, in an active-matrix type display apparatus, so-called monolithic circuit techniques in which are formed on the same glass substrate a thin film transistor for pixels that is for injecting electric charges into the pixels; and a thin film transistor for peripheral circuits that makes up a peripheral circuit such as a drive circuit, etc., for driving a scan line or signal line which is connected to the thin film transistor for pixels are becoming popular.

In this type of display apparatuses, a scan-line drive circuit selects a display element which is arranged two-dimensionally in units of rows and writes a voltage in accordance with display data to the selected display element to display an image. As this scan line drive circuit, a shift register which successively shifts an output signal based on a clock signal is used. In a dot sequential driving display apparatus, a similar shift register is provided within a signal-line drive circuit for driving a drive signal.

When the shift register is used in the scan-line drive circuit and the signal-line drive circuit, at the time of turning on or off a power supply circuit of a liquid crystal display apparatus, an operation of the shift register may become unstable, causing disturbances of the image to occur. In this case, when an all-on operation which causes high-level output signals to be output simultaneously from all output terminals of the shift register, the disturbances of the image displayed on a screen may be alleviated. The shift register which makes it possible such an all-on operation is disclosed in WO2012/029799 (Patent document 1), for example.

FIG. 22 is a diagram showing an exemplary configuration of a shift register according to the related art disclosed in WO2012/029799. The shift register shown therein is includes multi-stage shift register unit circuits SRU1, SRU2, SRU3, . . . , SRUn (n is a natural number which is equal to 2 or more) connected in cascade. To each of the shift register unit circuits SRU1, SRU2, SRU3, . . . , SRUn are supplied clock signals CK1 and CK2 and all-on control signals AON and AONB (where AONB is an inverted signal of AON). Moreover, a start pulse signal ST is input to a set terminal SET of the first-stage shift register unit circuit SRU1 and an output terminal OUT of pre-stage shift register circuits SRU2, SRU3, . . . , SRUn is connected to each set terminal SET of the second-stage-and-thereafter shift register unit circuits SRU2, SRU3, . . . , SRUn. The individual output terminals OUTs of the shift register unit circuits SRU1, SRU2, SRU3, . . . , SRUn are respectively connected to scan lines GL1, GL2, GL3, . . . , GLn. The respective shift register unit circuits SRU1, SRU2, SRU3, . . . , SRUn have the same configuration.

Below, an arbitrary one of the shift register unit circuits SRU1, SRU2, SRU3, . . . , SRUn will be called "a shift register unit circuit SRU".

FIG. 23 is a diagram showing an exemplary configuration of a related art shift register unit circuit SRU shown in the above-described FIG. 22. The shift register unit circuit SRU includes n-channel MOS (Metal Oxide Semiconductor) field-effect transistors (below-called "NMOS transistors") Q1 to Q9, a resistor R1, and capacitors CA and CB. Of these, the NMOS transistors Q5, Q6, Q7; the resistor R1; and the capacitor CB make up a non-active output control unit SRUA; the NMOS transistors Q1, Q4, and Q8 make up an active output control unit SRUB, the NMOS transistors Q2, Q9, and the capacitor CA make up an active output unit SRUC, and the NMOS transistor Q3 makes up a non-active output unit SRUD. The active output control unit SRUB controls the active output unit SRUC to bring an output signal to a high level, while the non-active output control unit SRUA controls a non-active output unit SRUD to bring the output signal to a low level.

Of the multi-stage shift register unit circuits SRU1, SRU2, SRU3, SRUn, a clock signal CK1 and a clock signal CK2 are respectively input to a clock terminal CK and a clock terminal CKB of an odd-numbered stage shift register unit circuit SRU, and, in a manner which is converse from the odd-numbered stage shift register unit circuit, the clock signal CK2 and the clock signal CK1 are respectively input to the clock terminal CK and the clock terminal CKB of an even-numbered stage shift register unit circuit SRU. The clock signal CK1 and the clock signal CK2 are, for example, clock signals whose phases are mutually offset by 180°, and a low-level segment of each of the signals is set such that they do not take a high level at the same time. The phase difference between the clock signal CK1 and the clock signal CK2 is not to be limited to 180°, so that the clock signal CK1 and the clock signal CK2 may be arbitrary clock signals with the limit that high-level periods thereof do not overlap mutually.

Next, an operation of the above-described related art shift register is described. FIGS. 24A and 24B are timing charts for explaining an exemplary operation of the related art shift register, where FIG. 24A is a time chart at the time of a normal operation and FIG. 24B is a time chart at the time of an all-on operation. In FIGS. 24A and 24B, a high level and a low level of the start pulse signal ST and the clock signals CK1 and CK2 respectively correspond to a power supply voltage VDD supplied to the shift register and a ground voltage VSS. Moreover, in FIGS. 24A and 24B, N11 and N21 represent nodes N1 and N2 of the first-stage shift register unit circuit SRU1, N12 and N22 represent nodes N1 and N2 of the second-stage shift register unit circuit SRU2, N1n and N2n represent nodes N1 and N2 of the nth-stage shift register unit circuit SRUn, and OUT1, OUT2, and OUTn represent output signals of the first-stage, second-stage, and n-th stage shift register unit circuits SRUs.

First, the normal operation is explained. In the normal operation, the all-on control signal AON is set to a low level, and the all-on control signal AONB, which is an inverted signal thereof, is set to a high level. When the start pulse signal ST is input to the set terminal SET of the first-stage shift register unit circuit SRU1 at time to, in the active output control unit SRUB, the NMOS transistor Q1 is turned on and the node N11 is pre-charged to a voltage (VDD–Vth), which is a drop from the power supply voltage VDD by the threshold voltage Vth of the NMOS transistor Q1.

In this case, in the non-active output control unit SRUA, the clock signal CK2 input to the clock terminal CKB and the start pulse signal ST input to the set terminal SET both take a high level, so that all of the NMOS transistors Q5, Q6, and Q7 are turned on. However, the resistor R1 is of a high resistance, so that the voltage of the node N21 takes a low level around the ground voltage VSS. In this way, the signal level of the gate of the NMOS transistors Q3 and Q4 takes a low level, so that the NMOS transistors Q3 and Q4 are both turned off.

Thereafter, when the respective signal levels of the clock signal CK2 input to the clock terminal CKB and the start pulse signal ST input to the set terminal SET take a low level of the ground voltage VSS, the NMOS transistors Q5 and Q7 are turned off, so that the node N21 takes a floating state, while the voltage of the node N21 is held by the capacitor CB. Moreover, when the signal level of the start pulse signal ST input to the set terminal SET takes a low level of the ground voltage VSS, the NOMS transistor is turned off, so that the node N11 takes a floating state, while the voltage of this node N11 is held by the capacitor CA.

Next, when the clock signal CK1 input to the clock terminal CK transitions to a high level at the time t1, the source voltage of the NMOS transistor Q2 rises. When the source voltage of the NMOS transistor Q2 rises, the voltage of the node N11 is pushed up, by the bootstrap effect by the capacitor CA, to a voltage which is higher than the power supply voltage VDD. When the gate voltage of the NMOS transistor Q2 takes a high voltage, the NMOS transistor Q2 passes on the high level of the clock signal CK1 input to the clock terminal CK to the output terminal OUT1. In this way, the output signal OUT1 takes a high level to be activated.

Thereafter, when the clock signal CK2 input to the clock terminal CKB transitions to a high level at the time t2, the NMOS transistor Q5 is turned to thereby cause the voltage of the node N21 to rise. When the voltage of the node N21 rises, the gate voltages of the NMOS transistor Q3 and the NMOS transistor Q4 rise and these NMOS transistors Q3 and Q4 are both turned on to simultaneous conduct discharging of the node N1 and pulling down of the output terminal OUT. In this way, the output signal OUT1 takes a low level to be deactivated. Thereafter, whenever the clock level of the clock signal CK2 which is input to the clock terminal CKB periodically takes a high level, the NMOS transistor Q5 is turned on to cause the signal level of the node N21 to maintained at a high level. As a result, at or after the time t2, the NMOS transistors Q3 and Q4 are both maintained on, while the output signal OUT1 is maintained at a low level.

The same also holds for the next-stage shift register unit circuit SRU2, so that, at the time t1, an output signal of the output terminal OUT1 of the first-stage shift register unit circuit SRU1 is input to the set terminal SET of the second-stage shift register unit circuit to cause a node N12 to be pre-charged. Then, at the time t2, an output signal OUT2 is output from the output terminal OUT of the second-stage shift register unit circuit SRU2 at the time t2. Then, when the clock signal CK1 transitions to a high level at the time t3, discharging of the node N12 in the second-stage shift register unit circuit SRU2 and pulling down of the output terminal OUT are conducted simultaneously, the output signal OUT2 takes a low level to be deactivated.

Below, the same operations are repeated up to the final-stage shift register unit circuit SRUn. As a result, the multiple shift register unit circuits SRU1, SRU2, SRU3, . . . , SRUn carry out the shift operation and successively output a high-level pulse signal to the scan lines GL1, GL2, GL3, . . . , GLn.

According to this shift register, a stable shift operation may be conducted using only two-phase clock signals CK1 and CK2 and a pre-stage output signal as input signals without producing a flow-through current.

Next, an all-on operation in which high-level output signals are output simultaneously from the all-output terminal OUT of the multiple shift register unit circuits SRU1, SRU2, SRU3, SRUn which make up the shift register are described.

To activate the all-on operation, an all-on control signal AON is set to a high level, while an all-on control signal AONB, which is an inverted signal thereof, is set to a low level. Moreover, in this example, the start pulse signal ST and the clock signals CK1 and CK2 are all set to a high level.

When the all-on control signal AON is set to a high level and the all-on control signal AONB is set to a low level, the NMOS transistor Q9 is turned on in the first-stage shift register unit circuit SRU1, while the NMOS transistor Q8 is turned off. Moreover, in this case, the NMOS transistor Q6 is turned off and the NMOS transistor Q7 is turned on, so that the node N21 takes a low level (a ground voltage VSS), while the NMOS transistor Q3 to which the gate is connected to the node N21 is turned off. In this way, no element exists which drives the output terminal OUT to a low level. When the NMOS transistor Q9 is turned on in such a state, a high-level output signal OUT1 is output to the output terminal OUT.

In the second-stage-and-thereafter shift register unit circuits SRU2, SRU3, . . . , SRUn, a high-level output signal from the pre-stage output terminal OUT is input to the SET terminal SET thereof, so that the second-stage-and-thereafter shift register unit circuit operates in the same manner as the first stage. Thus, an all-output signal which is output from the shift register unit circuits SRU1, SRU2, SRU3, . . . , SRUn to the scan lines GL1, GL2, GL3, . . . , GLn takes a high level to cause the all-on operation to be conducted.

Here, according to the technique disclosed in Patent document 1, when the start pulse signal ST input to the set terminal SET and the all-on control signal AON take a high level at the time of the all-on operation, the NMOS transistors Q5 and Q7 are both turned on, while the all-on control signal AONB takes a low level, and the NMOS transistor Q6 is turned off, so that a flow-through current within the non-active output control unit SRUA is shut off.

Moreover, when the all-on control signal AON takes a high level and the all-on control signal AONB takes a low level at the time of the all-on operation, the thin film transistor Q8 is turned off with the NMOS transistor Q6. In this way, the flow-through current within the active output control unit SRUB is shut off. Moreover, when the NMOS transistor Q6 is turned off, the signal level of the node N2 is brought to a low level by the NMOS transistor Q7 based on a signal input to the set terminal SET. When the signal level of the node N2 is brought to the low level, the NMOS transistor Q3 whose gate is connected to the node N2 is turned off, preventing a flow-through current from flowing through the NMOS transistors Q2 and Q3.

CITATION LIST

Patent Document

[PATENT DOCUMENT 1] International Publication No. 2012/029799

DISCLOSURE OF THE INVENTION

Problems to be Solved by the Invention

The number of transistors in the shift register needs to be reduced to achieve a narrower frame of the display apparatus. However, according to the above-described related art, there is a problem of having the NMOS transistors Q6 and Q8 for the necessity of preventing the flow-through current at the all-on operation, so that the number of transistors in the shift register increases. Moreover, the NMOS transistor Q1 and the NMOS transistor Q8 are connected in series, so that the charge voltage of the node N1 decreases because of the on resistance, the threshold voltage Vth of the NMOS transistor Q8 and the NMOS transistor Q1. Therefore, there is also a drawback that the signal level of the output signal which is output from the NMOS transistor Q2 whose gate is connected to the node N1 decreases.

An object of the present invention, which is conceived in light of the above-described problems, is to provide a shift register which makes it possible to reduce the number of transistors and a display apparatus which includes the shift register.

Means for Solving the Problems

A shift register according to one aspect of the present invention is a shift register in which a plurality of unit circuits are connected in cascade, wherein the unit circuit includes a first output transistor whose current path is connected between an output terminal and a clock terminal to which a first clock signal is provided; a second output transistor whose current path is connected between the output terminal and a predetermined potential node; a setting device which, when a control signal for setting a signal level of an output signal of the plurality of unit circuits to a predetermined signal level is active, sets a signal level of the output terminal to the predetermined signal level; a first output control device which provides a signal level of the control signal to a control electrode of the first output transistor to turn off the first output transistor when the control signal is active and responds to an input signal to turn on the first output transistor when the control signal is non-active; and a second output control device which turns off the second output transistor when the control signal is active and which, when the control signal is non-active, responds to a second clock signal following the first clock signal, or a signal synchronized with the first clock signal to turn off the first output transistor and also turns on the second output transistor.

Effects of the Invention

An aspect of the present invention makes it possible to reduce the number of transistors which make up a shift register.

MODE FOR CARRYING OUT THE INVENTION

[First Embodiment] (Explanation of Configuration)

A first embodiment of the present invention is explained.

Figure 1:
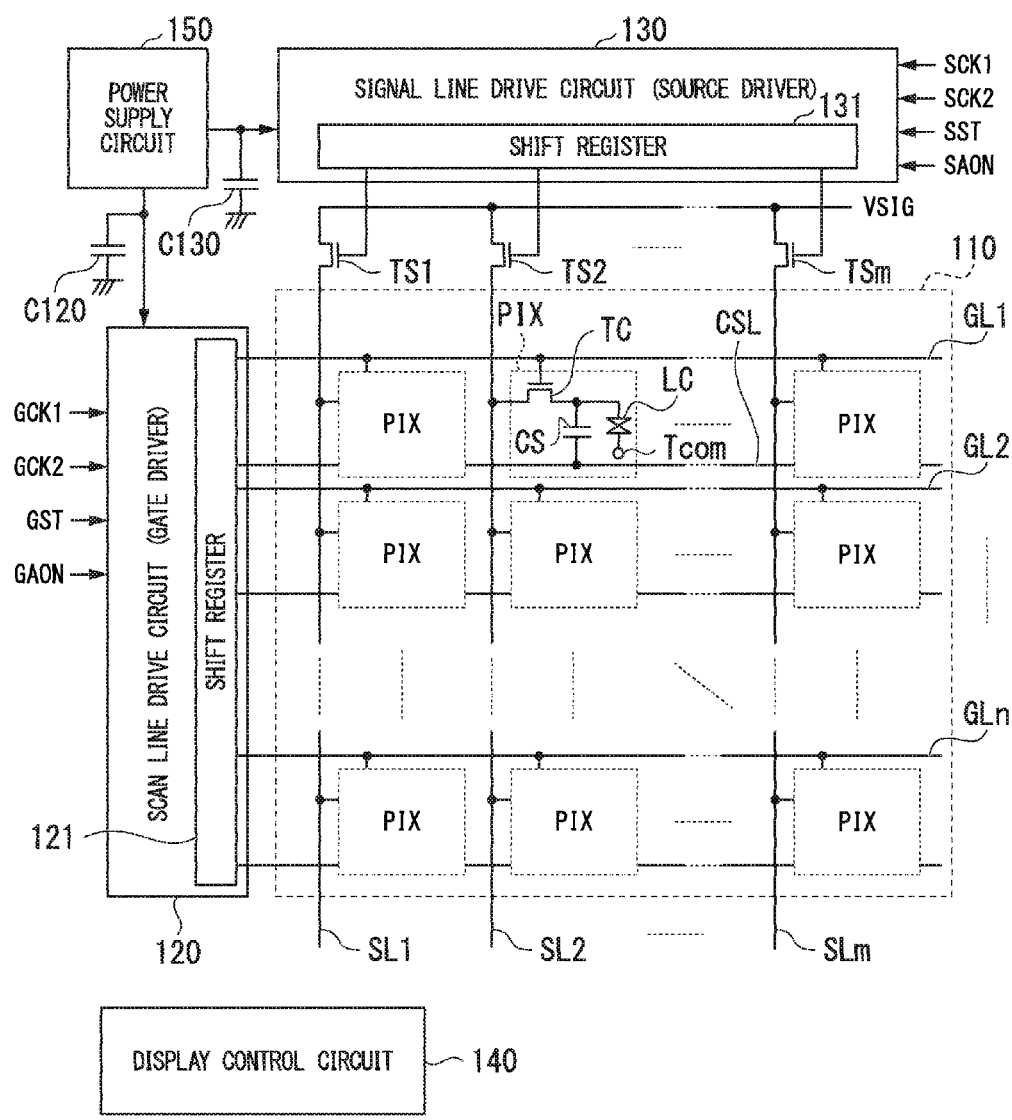
FIG. 1 is a schematic block diagram illustrating an exemplary configuration of a display apparatus according to a first embodiment of the present invention.

FIG. 1 is a block diagram illustrating an exemplary configuration of a display apparatus 100 according to the first embodiment of the present invention. The display apparatus 100, which is an active-matrix type liquid crystal display apparatus, for example, includes a display unit 110, a scan line drive circuit (gate driver) 120, a signal line drive circuit (source driver) 130, a display control circuit 140, a power supply circuit 150, a thin film transistor (analog switch) for a signal line selection TS1, TS2, ..., TSm, and other circuits.

The display unit 110 includes multiple signal lines SL1, SL2, ..., SLm (where m is a natural number) which are arranged such that they extend in the vertical line direction; multiple scan lines GL1, GL2, ..., GLn (where n is a natural number) which are arranged such that they extend in the horizontal line direction; and multiple pixel units PIXs.

The multiple pixel units PIXs are arranged in a matrix such that they are located at the intersections of the signal lines SL1, SL2, ..., SLm and the scan lines GL1, GL2, ..., GLn, and form a display region of the display apparatus 100. Moreover, each of the multiple pixel units PIXs includes a liquid crystal (liquid crystal material) LC which is arranged between two substrates; a thin film transistor TC for pixels that is provided on one substrate; a pixel capacitance unit (auxiliary capacitance) CS which is formed by the above-described liquid crystal LC; and an opposing electrode (transparent electrode) Tcom which is provided on the other substrate.

The thin film transistor for pixels TC has the gate connected to a scan line GLp which passes through the above-described intersections (where p is an arbitrary integer which fulfills $1 \leq p \leq n$), the source connected to a signal line SLq (where q is an arbitrary integer which fulfills $1 \leq q \leq m$), and the drain connected to a first terminal of the pixel capacitance unit CS. The pixel capacitance unit CS holds a voltage which corresponds to each pixel value (gray scale value) based on a data signal which displays a video (an image) on the display apparatus 100. A second terminal of the pixel capacitance unit CS is connected to an auxiliary capacitance electrode line CSL.

The present embodiment is to include the auxiliary capacitance electrode line CSL, envisaging a VA (vertical alignment) scheme. However, it is not limited to this example, so that the present invention can be applied to an arbitrary scheme such as an IPS (In plane switching) scheme, so that the second electrode of the pixel capacitance unit CS may be connected to the opposing electrode Tcom, for example.

In the present embodiment, the transistor film transistor for pixels TC is an n-channel type field effect transistor. However, the thin film transistor for pixels TC is not limited to the n-channel type thin film transistor, so that an arbitrary type of transistors may be used.

The scan line drive circuit 120, which is configured to include the shift register 121, successively supplies scan signals (below-described gate signals G1, G2, ... Gn) to scan lines GL1, GL2..., GLn by this shift register 121. The pixel unit PIX is driven in units of horizontal lines in response to a scan signal supplied from the shift register 121. The scan line drive circuit 120 outputs the scan signal to the respective scan lines GL1, GL2, ..., GLn at predetermined intervals by the shift register 121 successively shifting a gate start pulse signal GST in synchronization with gate clock signals GCK1 and GCK2. Moreover, the scan line drive circuit 120 has a function of setting all of the scan signals supplied to the scan lines GL1, GL2, ..., GLn to a high level (a predetermined signal level) based on a gate all-on control signal GAON at the time of an all-on operation which causes high-level output signals from all output terminals of the shift register to be output simultaneously. The scan line drive circuit 120 is configured by the above-described thin film transistor for pixels TC and the thin film transistor for peripheral circuits that is formed on the same glass substrate. This thin film transistor for peripheral circuits is an n-channel field effect transistor in a manner similar to the thin transistor for pixels TC.

The signal line drive circuit 130 includes the shift register 131. The signal line drive circuit 130 successively shifts a start pulse signal SST in synchronization with source clock signals SCK1 and SCK2 to successively select thin film transistors TS1, TS2, ..., TSm for signal line selection and outputs a data signal VSIG which supplies a voltage corresponding to the pixel value (grey scale value) to the respective pixel units PIXs to signal lines SL1, SL2, ... SLm via the thin film transistors TS1, TS2, ..., TSm for signal line selection. In this case, the signal line drive circuit 130 supplies a data signal VSIG corresponding to one horizontal line to the respective pixel units PIXs via the signal line SL1, SL2, ..., SLm selected by the thin film transistor TS1, TS2, ..., TSm for signal line selection.

At the time of the all-on operation, based on the source all-on control signal SAON, the signal line drive circuit 130 has a function of selecting all of the signal lines SL1, SL2, ..., SLm by the thin film transistors TS1, TS2, ..., TSm for signal line selection to set the selected signal lines to a high level (a predetermined signal level). Moreover, in the same manner as the scan line drive circuit 120, the signal line drive circuit 130 is configured by the thin film transistor for peripheral circuits that is formed on the same glass substrate as the thin film transistor for pixels TC.

According to the present embodiment, the scan line drive circuit 120 and the signal line drive circuit 130 are to be formed on the same glass substrate as the thin film transistor for pixels TC. However, the present embodiment is not to be limited to this example, so that it may be configured to form only the scan line drive circuit 120 on the same glass substrate as the thin film transistor for pixels TC and to supply a data signal from an external IC (integrated circuit) which includes a function of the signal line drive circuit 130. Moreover, only the signal line drive circuit 130 can be formed on the same glass substrate as the thin film transistor for pixels TC with the scan line drive circuit 120 being provided externally.

The display control circuit 140 generates various control signals required to display an image on the display unit 110 to supply the generated control signals to the scan line drive circuit 120 and the signal line drive circuit 130. In the present embodiment, the display control circuit 140 generates a control signal for causing the image to be displayed on the display unit 110 in a display period of the image to supply the generated control signal to the scan line drive circuit 120 and the signal line drive circuit 130. For example, the display control circuit 140 generates the above-described gate clock signals GCK1, GCK2, source clock signals SCK1, SCK2, a gate start pulse signal GST, a source start pulse signal SST, a gate all-on control signal GAON, a source all-on control signal SAON, a data signal VSIG, etc.

The power supply circuit 150 is to supply an operation power supply voltage (VDD, VH, VL, etc.) of the scan line drive circuit 120 and the signal line drive circuit 130. The capacitance C120 is formed in a power supply wiring between the power supply circuit 150 and the scan line drive circuit 120, while the capacitance C130 is formed in a power supply wiring between the power supply circuit 150 and the signal line drive circuit 130.

Figure 2:
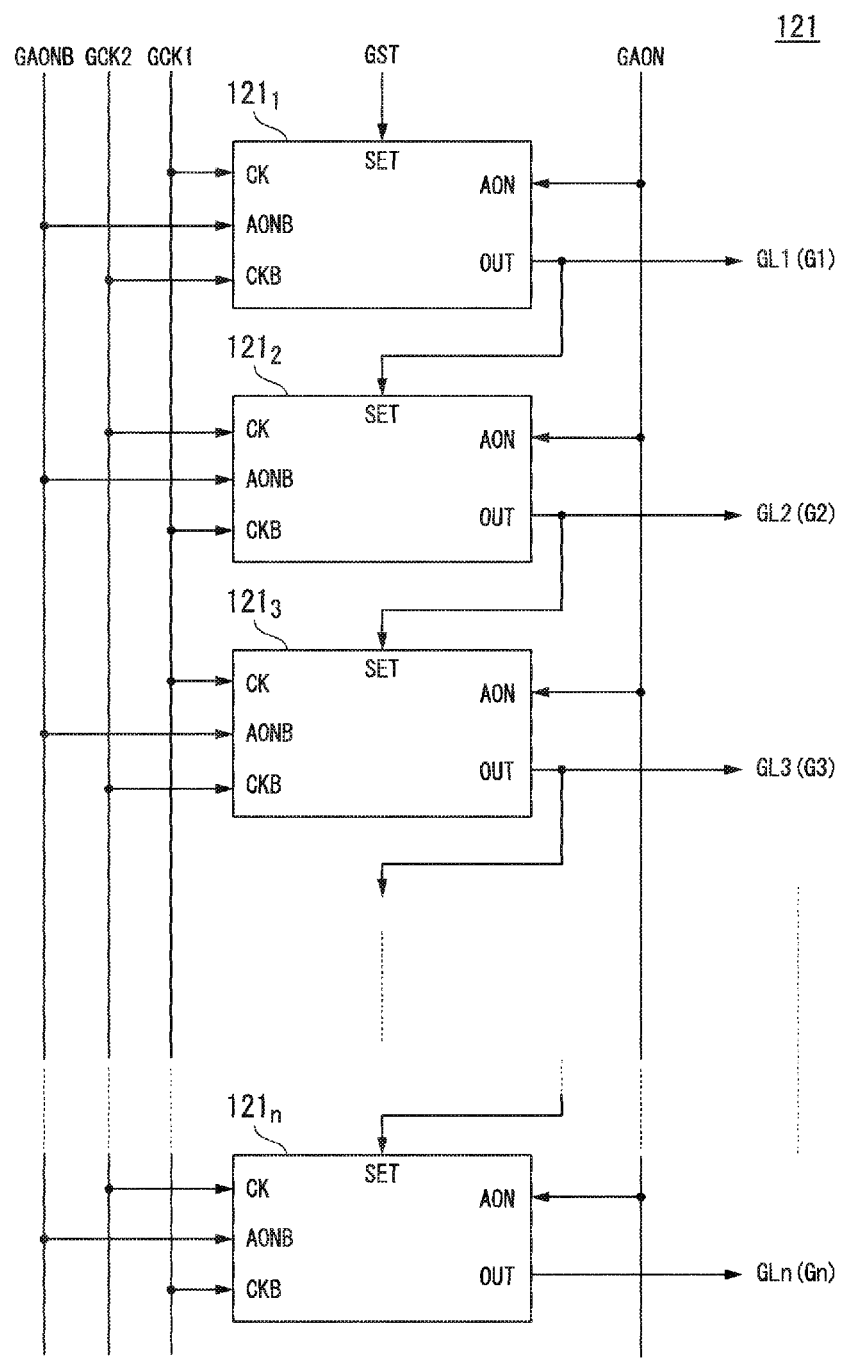
FIG. 2 is a schematic block diagram illustrating an exemplary configuration of a shift register according to the first embodiment.

Next, the configuration of the shift register 121 according to the first embodiment is described with reference to FIG. 2. FIG. 2 is a schematic block diagram showing an exemplary configuration of the shift register 121 in the first embodiment. As shown in FIG. 2, the shift register 121 includes multiple shift register unit circuits $121_1$, $121_2$, $121_3$, ..., $121_n$ which correspond to multiple scan lines GL1, GL2, GL3, ..., GLn. These multiple shift register unit circuits $121_1$, $121_2$, $121_3$, ..., $121_n$ are connected in cascade.

Each of the multiple shift register unit circuits $121_1$, $121_2$, $121_3$, ..., $121_n$ has the same configuration, and, herein below, when referring to each of the shift register unit circuits $121_1$, $121_2$, $121_3$, ..., $121_n$, it is collectively called "a shift register unit circuit 1211". The shift register unit circuit 1211 includes clock terminals CK, CKB, a set terminal SET, an output terminal OUT, and all-on control terminals AON, AONB.

Of multiple shift register unit circuits $121_1$, $121_2$, $121_3$, ..., $121_n$, a gate clock signal GCK1 is input to the clock terminal CK of an odd-numbered stage shift register unit circuit, while a gate clock signal GCK2 is input to the clock terminal CKB. Conversely, a gate clock signal GCK2 is input to the clock terminal CK of an even-numbered shift register unit circuit, while a gate clock signal GCK1 is input to the clock terminal CKB. A gate all-on control signal GAON is input to the all-on control terminal AON of the multiple shift register unit circuits $121_1$, $121_2$, $121_3$, ..., $121_n$, while a gate all-on control signal GAONB, which is an inverted signal of the gate all-on control signal GAON, is input to the all-on control terminal AONB. Moreover, of the multiple shift register unit circuits $121_1$, $121_2$, $121_3$, ..., $121_n$, a gate start pulse signal GST is input to the set terminal SET of the first-stage shift register unit circuit $121_1$, while an output signal of the pre-stage shift register unit circuit is input to the respective set terminals SET of the second-stage-and-thereafter shift register unit circuit.

Upon receiving a gate start pulse signal GST from the display control circuit 140, the shift register 121, which includes multiple-stage shift register unit circuits $121_1$, $121_2$, $121_3$, ..., $121_n$, carries out a shift operation based on the gate clock signals GCK1 and GCK2 and successively output gate signals G1, G2, G3, ..., Gn to scan lines GL1, GL2, GL3, ..., GLn. According to the present embodiment, phases of the gate clock signal GCK1 and the gate clock signal GCK2 are mutually different by 180° as shown in the below-described FIGS. 4A and 4B. Moreover, the gate clock signal GCK1 and the gate clock signal GCK2 have the segment of the low level thereof set such that they do not take the high level simultaneously. The phase difference of the gate clock signal GCK1 and the gate clock signal GCK2 is not to be limited to 180', so that the clock signal CK1 and the clock signal CK2 may be arbitrary clock signals with a limit that their high level time periods do not overlap mutually. Moreover, each signal level of the above-described non-overlapping time period may be arbitrary in accordance with each logic (positive logic/negative logic) of the gate clock signal GCK1 and the gate clock signal GCK2. The same applies to the source clock signals SCK1 and SCK2.

Figure 3:
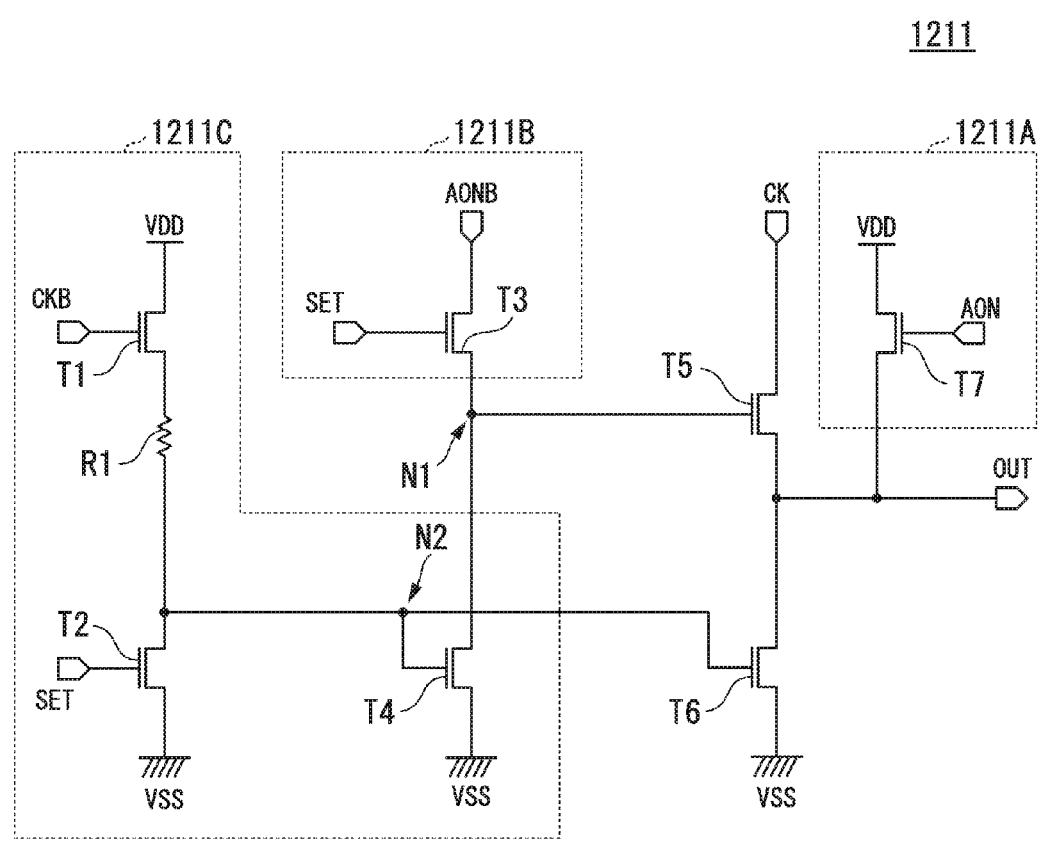
FIG. 3 is a circuit illustrating an exemplary configuration of a shift register unit circuit according to the first embodiment.

Next, the configuration of the shift register unit circuit 1211 according to the present embodiment is described with reference to FIG. 3. FIG. 3 is a circuit diagram illustrating an exemplary configuration of the shift register unit circuit 1211 according to the present embodiment.

The shift register unit circuit 1211 includes thin film transistors T1, T2, T3, T4, T5, T6, T7, which are n-channel field effect transistors, and a resistor R1. The thin film transistor T1 has a power supply voltage VDD provided to the drain thereof and has the gate thereof connected to a clock terminal CKB. The clock terminal CKB has a gate clock signal GCK2 input thereto. When the gate clock signal GCK2, which is input to the clock terminal CKB, takes a high level, the thin film transistor T1 outputs, from the source thereof, a voltage representing a drop corresponding to a threshold voltage Vth of the thin film transistor T1 with the gate voltage thereof as the reference.

The resistor R1 has one end thereof connected to the source of the thin film transistor T1 and the other end thereof connected to the drain of the thin film transistor T2. The resistance value of the resistor R1 is set to a high value such that the drain voltage of the thin film transistor T2 takes a low level when the thin film transistor T1 and the thin film transistor T2 are both on.

The arrangement positions of the resistance R1 and the resistance R2 may be swapped. More specifically, one end of the resistance R1 is provided the power supply voltage VDD, the drain of the thin film transistor T1 is connected to the other end of the resistance R1, and the drain of the thin film transistor T2 may be connected to the source of the thin film transistor T1.

The thin film transistor T2 has the source thereof connected to a grand node (a predetermined potential node) and has the gate thereof connected to the set terminal SET. To the set terminal SET is input the gate start pulse signal GST or an output signal of the previous-stage shift register unit circuit. More specifically, the gate start pulse signal GST is input to the set terminal SET of the first-stage shift register unit circuit $121_1$, while an output signal of the pre-stage shift register unit circuit is input to the set terminal SET of the respective second-stage-and-thereafter shift register unit circuits $121_2$, $121_3$, ..., $121_n$. The thin film transistor T2 is turned on when the signal input to the set terminal SET takes a high level and outputs a low level corresponding to the ground voltage VSS from the drain thereof.

The thin film transistor T3 has the drain thereof connected to the all-on control terminal AONB and has the gate thereof connected to the set terminal SET. A gate all-on control signal GAON, which is an inverted signal of the gate all-on control signal GAON, is input to the all-on control terminal AONB. The thin film transistor T3 outputs, from the source thereof, a voltage representing a drop corresponding to the threshold voltage Vth of the thin film transistor T3 with the gate voltage thereof as the reference when the gate start pulse signal GST input to the set terminal SET or the output signal of the pre-stage shift register unit circuit takes a high level.

The thin film transistor T4 has the drain thereof connected to the source of the thin film transistor T3, has the gate thereof connected between the drain of the thin film transistor T2 and the resistor R1, and the source connected to a grand node. When a signal level of the connecting point between the thin film transistor T2 and the resistance R1 take a high level, the thin film transistor T4 turns on, and outputs a low level corresponding to the ground voltage VSS from the drain thereof.

The thin film transistor T5 (a first output transistor) has the drain thereof connected to the clock terminal CK, the gate thereof connected to the connection point between the source of the thin film transistor T3 and the drain of the thin film transistor T4, and the source thereof connected to the output terminal OUT. The gate clock signal GCK1 is input to the clock terminal CK. When the signal level of the connection point between the source of the thin film transistor T3 and the drain of the thin film transistor T4 take a high level, the thin film transistor T5 transmits the signal level of the gate clock signal GCK1 input to the clock terminal CK to a high level. Then, the high level of the gate clock signal GCK1 is supplied to the output terminal OUT via the thin film transistor T5 without producing a voltage drop caused by the threshold voltage Vth of the thin film transistor T5 due to the bootstrap effect based on the parasitic capacitance between the gate and the source of the thin film transistor T5, for example.

The thin film transistor T6 (a second output transistor) has the drain thereof connected to the output terminal OUT, the gate thereof connected to the connection point between the drain of the thin film transistor T2 and the resistance R1, and the source thereof connected to the grand node. The thin film transistor T6 is turned on when the signal level of the connection point between the drain of the thin film transistor T2 and the resistance R1 and outputs a low level corresponding to the ground voltage VSS to the output terminal OUT from the drain thereof.

The thin film transistor T7 has a power supply voltage VDD provided to the drain thereof, and the gate thereof connected to the all-on control terminal AON and the source thereof connected to the output terminal OUT. The gate all-on control signal GAON is input to the all-on control terminal AON. When the gate all-on control signal GAON input to the all-on control terminal AON takes a high level, the thin film transistor T7 outputs to the output terminal OUT from the source thereof a voltage representing a drop corresponding to the threshold voltage Vth of the thin film transistor T7 with the gate voltage thereof (high level of the gate all-on control signal GAON) as a reference.

The thin-film transistor T7 may be provided in the form of a so-called diode connection. More specifically, the gate of the thin film transistor T7 may be connected to the drain thereof, the source thereof may be connected to the output terminal OUT, and the gate all-on control signal AON may be input to the connection point of the gate and the drain of the thin film transistor T7.

According to the present embodiment, the connection point of the source of the thin film transistor T3 and the drain of the thin film transistor T4 that are described above forms a node N1, while the connection point of the drain of the thin film transistor T2 and the resistor R1 forms a node R2. Moreover, according to the present embodiment, the thin film transistor T5 forms a first output transistor whose current path is connected between the output terminal OUT and the clock terminal CK to which is provided the clock signal CK1. Moreover, the thin film transistor T6 forms a second output transistor whose current path is connected between the output terminal OUT and the grand node (predetermined potential node). Furthermore, the thin film transistor T7 forms a setting device 1211A which sets a signal level of the output terminal OUT to a high level (a predetermined signal level) when a gate all-on control signal GAON input to the all-on control terminal AON for setting, to a high level (predetermined signal level), the signal level of an output signal of multiple shift register unit circuits $121_1, 121_2, 121_3, \ldots, 121_n$.

Moreover, according to the present embodiment, the thin film transistor T3 forms a first output control device 1211B which turns off the thin film transistor T5 by providing a signal level of the gate all-on control signal GAONB to a control electrode of the thin film transistor T5 when the gate all-on control signal GAONB, which is input to the all-on control terminal AONB, is active, and which turns on the thin film transistor T5 in response to an input signal input to the set terminal SET when the gate all-on control signal GAONB is non-active. Furthermore, the thin film transistors T1, T2, T4 and the resistor R1 form a second output control device 1211C which turns off the thin film transistor T6 when the gate all-on control signals GAON and GAONB that are input to the all-on control terminals AON and AONB are active and which turns off the thin film transistor T5 and turns on the thin film transistor T6 in response to a signal synchronized to a gate clock signal GCK2 which follows a gate clock signal GCK1, or a signal which is synchronized with the gate clock signal GCK1 when the gate all-on control signals GAON and GAONB are active. While the display control circuit 140 is arranged to generate the gate clock signal GCK1 and the gate clock signal GCK2 to supply the generated results to the scan line drive circuit 120 according to the present embodiment, it may be arranged to generate, in a derivative manner, the gate clock signal GCK1 and the gate clock signal GCK2 within the scan line drive circuit 120 from one clock signal supplied to the scan line drive circuit 120. The above-described "signal which is synchronized with the gate clock signal GCK1" is a signal corresponding to the gate clock signal GCK2 when generated with the gate clock signal GCK1 from the one clock signal within the scan line drive circuit 120. In other words, techniques of generating the gate clock signal GCK1 and the gate clock signal GCK2 are arbitrary, so that they may be generated outside the scan line drive circuit 120, or may be generated within the scan line drive circuit 120.

Apparently, the shift register unit circuit 1211 that has such a configuration as described above takes in a signal input to the set terminal SET at the timing which is synchronized with the gate clock signal GCK2 input to the clock terminal CKB and transfers the taken in signal to the output terminal OUT at the timing which is synchronized to the gate clock signal GCK1 input to the clock terminal CK. In this way, the shift register unit circuit 1211 functions a so-called master-slave-type flip flop.

Next, the signal line drive circuit 130 is described.

While the shift register 131 included in the signal line drive circuit 130 has basically the same configuration as that of the shift register 121 included in the scan line drive circuit 120, it is different from the shift register 121 of the scan line drive circuit 120 in that it includes m-stage shift register unit circuits corresponding to m signal lines SL1, SL2, SLm.

In the configuration of the shift register unit circuit 1211 shown in FIG. 3, a source clock signal SCK1 is input to the clock terminal CK of the odd-numbered stage shift register unit circuits that make up the shift register 131, a source clock signal SCK2 is input to the clock terminal CKB, and, conversely, a source clock signal SCK2 is input to the clock terminal CK of the even-numbered stage shift register unit circuits and the source clock signal SCK1 is input to the clock terminal CKB.

Moreover, a source all-on control signal SAON is input to the all-on control terminal AON of the m-stage shift register unit circuit which makes up the signal line drive circuit 130 and a source all-on control signal SAONB, which is an inverted signal of the source all-on control signal SAON, is input to the source all-on control terminal AONB. Moreover, a source start pulse signal SST is input to the set terminal SET of the first-stage shift register unit circuit and an output signal of the pre-stage shift register unit circuit is input to the respective set terminals SET of the second-stage-and-thereafter shift register unit circuits of the m-stage shift register unit circuits which make up the signal line drive circuit 130.

Upon receiving the source start pulse signal SST from the display control circuit 140, the m-stage shift register unit circuit which makes up the shift register 131 carries out a shift operation based on the source clock signals SCK1 and SCK2 and successively outputs a selection signal to each gate of the thin film transistors for signal line selection TS1, TS2, . . . , TSm. The phases of the source clock signals SCK1 and SCK2 differ from each other by 180° in the same manner as the above-described gate clock signals GCK1 and GCK2, and, moreover, the source clock signal SCK1 and the source clock signal SCK2 have the low level segment thereof set such that they do not take the high level simultaneously.

While the shift register unit circuit 1211 which makes up the scan line drive circuit 120 and the signal line derive circuit 130 is arranged to output a ground voltage VSS of the grand node as a low level of the output signal and outputs a positive power supply voltage VDD as a high level of the output signal according to the present embodiment, it is not limited to this example, so that a negative voltage VL (for example, −5V) may be output as a low level and a positive voltage VH (for example, +10V) may be output as a high level. In this case, the ground voltage GSS (a predetermined potential) shown in the respective figures represent a negative voltage.

(Explanations of Operations)

Next, operations of the image display apparatus 100 according to the present embodiment are explained.

The operational characteristics of the display apparatus 100 according to the present embodiment lies in the operations of the shift register 121 making up the scan line drive circuit 120 and the shift register 131 making up the signal line drive circuit 130. Then, operations of the shift register 121 making up the scan line drive circuit 120 are described in detail. The operation of the shift register 131 making up the signal line drive circuit 130 is the same as that of the shift register 121, so that explanations of the operation will be omitted.

Figure 4A:
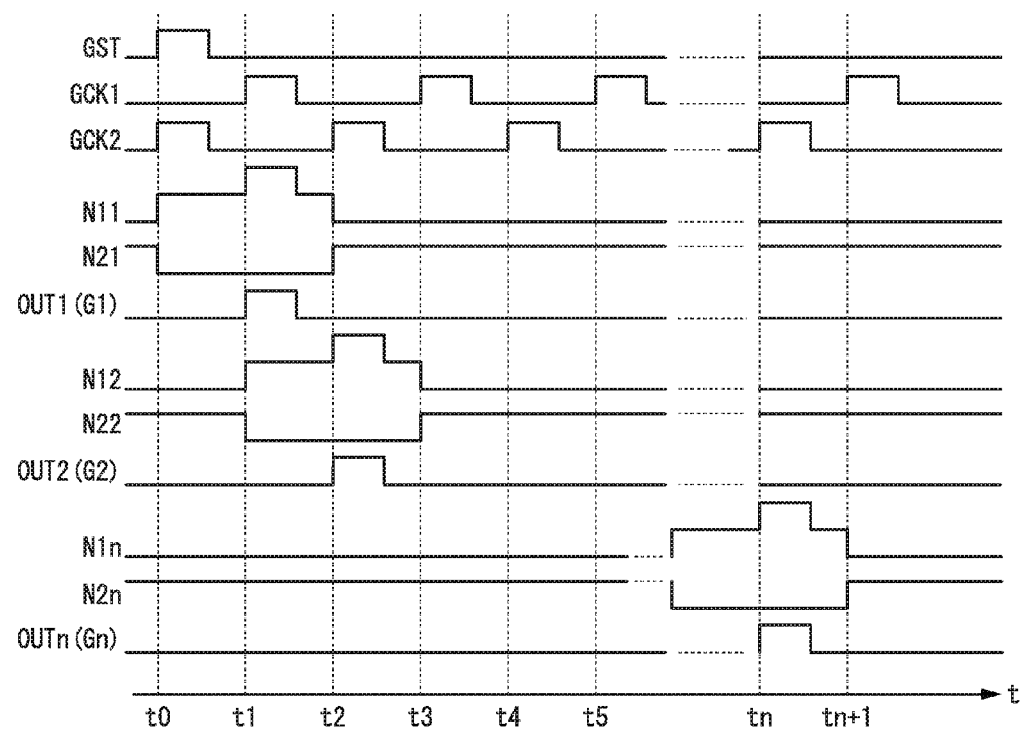
FIG. 4A is a time chart illustrating an exemplary operation of the shift register according to the first embodiment.
Figure 4B:
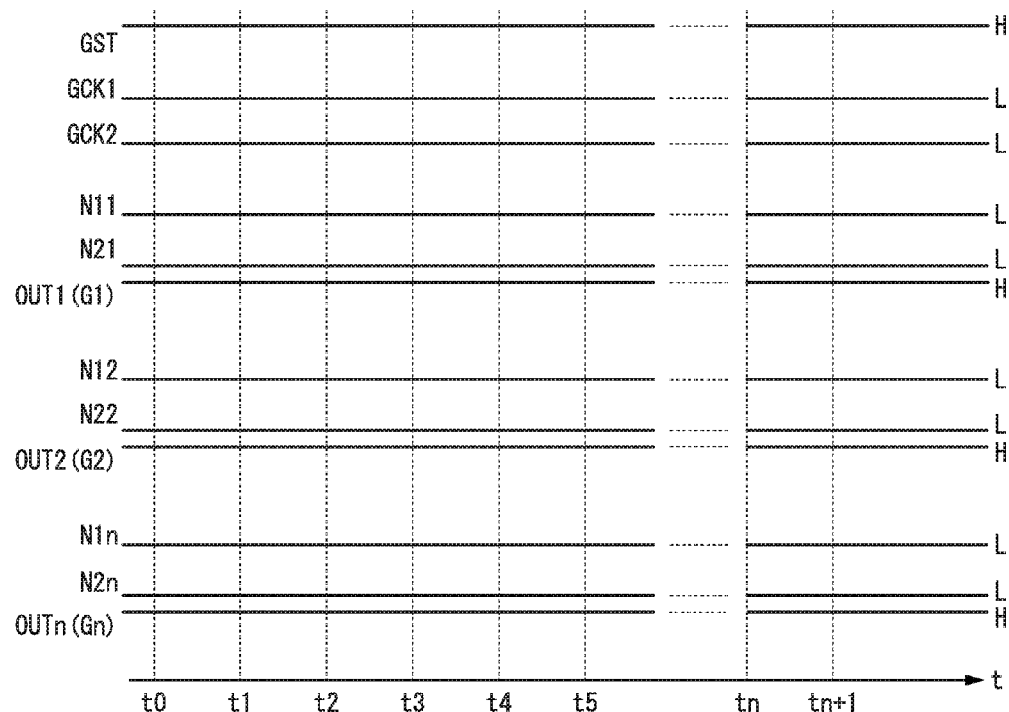
FIG. 4B is a time chart illustrating an exemplary operation of the shift register according to the first embodiment.

FIGS. 4A and 4B are time charts showing exemplary operation of the shift register 121 according to the first embodiment, where FIG. 4A is a time chart at the time of normal operations and FIG. 4B is a time chart at the time of all-on operations. In FIGS. 4A and 4B, high and low levels of the gate start pulse signal GST, the gate clock signals GCK1 and GCK2 are respectively signal levels corresponding to a voltage VDD of the operation power supply that is supplied to the shift transistor and a ground voltage VSS. Moreover, in the normal operation, the gate all-on control signal GAON is set to the low level, while the gate all-on control signal GAONB, which is an inverted signal thereof, is set to the high level. Moreover, in FIGS. 4A and 4B, N11 and N21 show nodes N1 and N2 of the first-stage shift register unit circuit $121_1$, N12 and N22 show nodes N1 and N2 of the second-stage shift register unit circuit $121_2$, N1$n$ and N2$n$ show nodes N1 and N2 of the nth-stage shift register unit circuit $121_n$, and OUT1, OUT2, and OUTn show output signals of the first-stage, second-stage, and nth-stage shift register unit circuits.

"H" shown indicates a high level, while "L" indicates a low level.

<Normal Operation>

First, with reference to FIG. 4A, the normal operation of the shift register 121 is described with reference to FIG. 4A.

In the normal operation, the gate all-on control signal GAON is set to the low level, while the gate all-on control signal GAONB, which is an inverted signal thereof, is set to the high level. In this case, as shown in FIG. 4A, at the time t0, when the gate start pulse signal GST, which is input to the set terminal SET of the first-stage shift register unit circuit $121_1$ transitions to a high level at the time t0, the thin film transistor T3 is turned on. Moreover, at the time t0, the gate clock signal GCK2 input to the clock terminal CKB transitions to the high level and the gate start pulse GST input to the set terminal SET also transitions to the high level, so that the thin film transistor T1 and the thin film transistor T2 are both turned on. In this case, the resistor R1 causes current supplied from the thin film transistor T1 to be suppressed, so that the signal level of the node N21 takes a low level around the ground voltage VSS by the thin film transistor T2. When the node N21 takes the low level, the thin film transistor T4 and the thin film transistor T6 are both turned off. As a result, the node N11 is charged to a voltage (VDD−Vth) which represents a drop corresponding to the threshold voltage Vth from the power supply voltage VDD (a power supply voltage VDD corresponding to the high level of the gate start pulse signal GST input to the set terminal) by the thin film transistor T3.

Thereafter, when the gate clock signal GCK2 input to the clock terminal CKB and the gate start pulse signal GST input to the set terminal SET transition to the low level, the thin film transistor T1 and the thin film transistor T2 are both turned off. In this way, the node 21 is brought to a floating state, so that the signal level (low level) of this node N21 is held. Moreover, when the gate start pulse signal GST input to the set terminal SET takes a low level, the thin film transistor T3 is turned off. Therefore, the node N11 is also brought to the floating state, so that the charged voltage (VDD−Vth) is held.

Next, at the time t1, when the gate clock signal GCK1 input to the clock terminal CK transitions to the high level, the high level of the gate clock signal GCK1 is transmitted to the output terminal OUT via the thin film transistor T5 whose drain is connected to this clock terminal CK, and the signal level of the output signal OUT1 starts rising. When the signal level of the output signal OUT1 rises, the signal level of the node N11 is pushed up by the bootstrap effect via the capacitance component between the gate and the source of the thin film transistor T5. Thus, the gate voltage of the thin film transistor T5 gets higher than the source voltage of the thin film transistor T5, so that the thin film transistor T5 is turned on. In this way, the high level (a signal level corresponding to the power supply voltage VDD) of the gate clock signal GCK1 input to the clock terminal CK is transmitted to the output terminal OUT without causing a voltage drop due to the threshold voltage Vth of the thin film transistor T5. As a result, the shift register unit circuit $121_1$ outputs, as an output signal OUT1, a gate signal G1 having a high level corresponding to the power supply voltage VDD.

Next, at the timing t2, when the gate clock signal GCK2 input to the clock terminal CKB transitions to a high level at the time t2, the thin film transistor T1 is turned on, the node N21 is charged via this thin film transistor T1 and the resistor R1, and the voltage of the node N21 rises. In this way, the thin film transistors T4 and T6 whose gate is connected to the node N21 is turned on and these thin film transistors T4 and T6 respectively pull down the node N11 and the output terminal OUT. As a result, the thin film transistor T5 whose gate is connected to the node N11 is turned off and the output signal OUT transitions to the low level.

Thereafter, the gate start pulse signal GST input to the set terminal SET is maintained at a low level, so that the thin film transistor T2 is maintained in an off state. Moreover, the node N21 is maintained at a state such that the node N21 is charged to a high level by the thin film transistor T1, which is turned on in response to the high level of the gate clock signal GCK2, which is periodically input to the clock terminal CKB. In this way, the thin film transistors T4 and T6 whose gate is connected to the node N21 is maintained in an on state. Moreover, in this case, the thin film transistor T3 whose gate is connected to the set terminal SET is turned off, so that the node N11 is pulled down by the thin film transistor T4, and the signal level of the node N11 is maintained at a low level corresponding to the ground potential VSS. Thus, the thin film transistor T5 whose gate is connected to the node N11 is maintained at an off state. As a result, the output signal OUT1 is maintained to a low level by the thin film transistor T6, which is maintained at an on state.

The operation of the second-stage shift register unit circuit $121_2$ is carried out with a delay of a half clock relative to the operation of the first-stage shift register unit circuit $121_1$ upon receipt of the output signal OUT1 of the first-stage shift register unit circuit $121_1$. In the operation itself, which is the same as that of the first-stage shift register unit circuit $121_1$, the shift register unit circuit $121_2$ causes the output signal OUT2 to transition to a high level at a time t2, which is delayed by a half clock relative to the output signal OUT1 of the first-stage shift register unit circuit $121_1$. Below, in the same manner, the third-stage-and-thereafter shift register unit circuits $121_3$, ... $121_n$ successively output output signals OUT3, ..., OUT n with a delay of a half clock relative to the output signal of the pre-stage shift register unit circuit.

The shift operations of the shift register 121, which is made of the above-described n-stage shift register unit circuits $121_1$, $121_2$, $121_3$, ..., $121_n$, cause the respective output signals OUT1, OUT2, OUT3, ..., OUTn of each of the shift register unit circuits to be successively output to the scan lines Gl1, GL2, GL3, ..., GLn as the gate signals G1, G2, G3, ..., Gn.

<All-on Operation>

Next, an all-on operation of the shift register 121 is described with reference to FIG. 4B. In the all-on operation, the gate all-on control signal GAON is set to a high level, while the gate all-on control signal GAONB, which is an inverted signal thereof, is set to a low level. In other words, the gate all-on control signals GAON and GAONB are activated. Moreover, as shown in FIG. 4B, the gate start pulse signal GST is set to a high level, while the gate clock signals GCK1 and GCK2 are set to a low level.

In this case, in the first-stage shift register unit circuit $121_1$, the thin film transistor T1 whose gate is connected to the clock terminal CKB to which is input the gate clock signal GCK2 set to the low level is turned off. Moreover, the thin film transistor T2 whose gate is connected to the set terminal SET to which is input the gate start pulse signal GST set to the high level is turned on. In this way, the node N21 is pulled down by the thin film transistor T2, so that the signal level of the node N21 takes a low level. As a result, the thin film transistors T4 and T6 whose gate is connected to the node N21 are both turned off.

Moreover, the thin film transistor T3 whose gate is connected to the set terminal SET to which is input a gate start pulse signal GST which is set to a high level is turned on. When the thin film transistor T3 is turned on, the gate all-on control signal GAONB (a low level corresponding to the ground voltage VSS) is transmitted to the gate of the thin film transistor T5 via the thin film transistor T3. Here, the gate all-on control signal GAONB is set to a low level which corresponds to the ground voltage VSS, so that the voltage between the source and the gate of the thin film transistor T3 exceeds the threshold voltage Vth. Thus, the gate all-on control signal GAONB at the low level is provided to the gate of the thin film transistor T5 via the thin film transistor T3 without causing a voltage drop due to the threshold voltage Vth of the thin film transistor T3. In this way, a low level is provided to the gate of the thin film transistor T5, so that the thin film transistor T5 is turned off. Here, the signal level of the gate of the thin film transistor T5 is supplied via the thin film transistor T3 used for charging the node N1 in normal operations, not the thin film transistor T4 connected to the ground side. In other words, according to the present embodiment, the thin film transistor T3 is used in a manner which is shared between the normal operation and the all-on operation, thus reducing the number of transistors of the shift register unit circuit 1211.

Moreover, the thin film transistor T7 whose gate is connected to the all-on control terminal AON to which is provided the gate all-on control signal GAON set to the high level is turned on. When the thin film transistor T7 is turned on, the power supply voltage VDD is supplied to the output terminal OUT via the thin film transistor T7, and the thin film transistor T7 causes the signal level of the output terminal OUT to be set to the high level. Here, as described above, the thin film transistors T5 and T6 that are connected to the output terminal OUT are both turned off, so that the thin film transistor T7 causes the signal level of the output terminal OUT to be set to the high level without receiving the effect of the thin film transistors T5 and T6. In this way, the first-stage shift register unit circuit $121_1$ outputs the output signal OUT1 at the high level.

The odd-numbered stage shift register unit circuits to which are input the gate clock signals GCK1 and GCK2 in a manner similar to the first-stage shift register unit circuit $121_1$, of the multiple shift register unit circuits $121_1$, $121_2$, $121_3$, ..., $121_n$, operates in the same manner as the first-stage shift register unit circuit $121_1$ in the all-on operation, and outputs a high-level output signal. Moreover, for the even-numbered stage shift register unit circuit, gate clock signals GCK1 and GCK2 input to the clock terminals CK and CKB are reversed relative to the odd-numbered stage shift register unit circuit, while, at the time of the all-on operation, the signal level of the gate clock signals GCK1 and GCK2 is set to the low level. Therefore, at the time of the all-on operation, the signal level input to the respective terminals of the even-numbered stage shift register unit circuit is the same as the signal level input to the respective terminals of the odd-numbered stage shift register unit circuit. Therefore, the all-on operation of the even-numbered stage shift register unit circuit is also described in the same manner as the odd-numbered stage shift register unit circuit, so that, in the all-on operation, the even-numbered stage shift register unit circuit outputs an output signal at the high level.

As described above, the shift register 121 which makes up the scan line drive circuit 120 outputs high-level output signals OUT1, OUT2, . . . , OUTn as gate signals G1, G2, . . . , Gn, so that an all-on operation is carried out.

Even for the all-on operation of the shift register 131 which makes up the signal line drive circuit 130, a similar explanation may be given as the shift register 121 which makes up the above-described scan line scan circuit 120.

<Operation for Applying to on Sequence>

Figure 5:
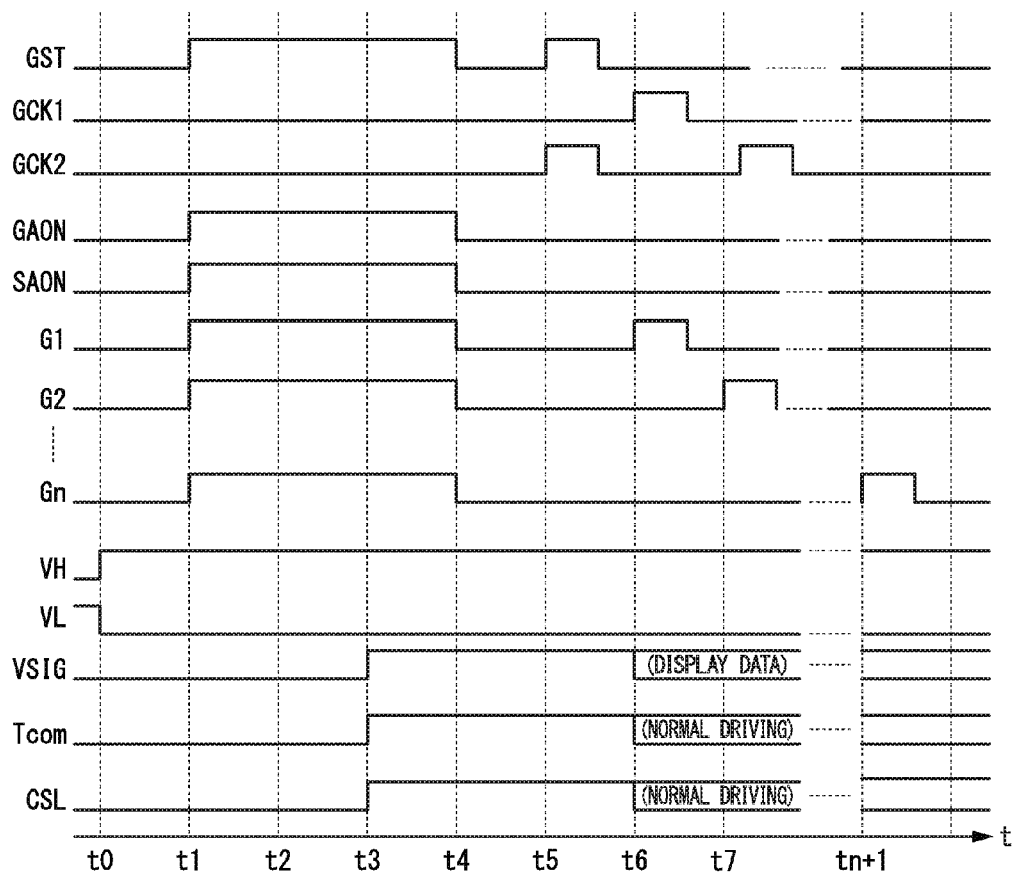
FIG. 5 is a time chart for explaining an exemplary operation of an on sequence of a display apparatus according to the first embodiment.

Next, a case is described of applying an all-on operation of the shift register 121 to an on sequence carried out when turning on the power of the display apparatus 100. FIG. 5 is a time chart for explaining an operation in an on sequence of the display apparatus 100 according to the first embodiment.

Immediately after turning on the power, the potential of the video signal line (the signal line of the data signal VIG), the potential of the opposing electrode Tcom, or the potential of the auxiliary capacitance electrode line CSL becomes unstable, possibly causing unintended charges to be accumulated in the pixel unit PIX. Such a phenomenon is caused by the logic control of the circuit within the apparatus not being carried out normally when the power supply circuit 150 is not surely launched, More specifically, this phenomenon is caused by unwanted charges entering the pixel unit PIX from the signal line of the data signal VSIG and also the potential of the opposing electrode Tcom or the potential of the auxiliary capacitance electrode line CSL becoming unstable, so that a potential difference is produced between the opposing electrode Tcom and the pixel electrode (not shown). This phenomenon may be a cause for producing image noise.

For such a phenomenon, it is effective to bring the thin film transistor for pixels TC for the pixel units PIXs into conduction and instantaneously release electric charges from all of the pixel units PIXs. The instantaneous release of the charges from the pixel units PIXs is not perceived as an image change by the human vision, almost preventing the viewer from providing a sense of discomfort.

Here, in the on sequence at the time of launching the power, at the time t1, which is immediately after the time t0 when the power is turned on, the gate all-on control signal GAON and the source all-on control signal SAON are set to the active state (high level) to carry out the all-on operation. In this way, the thin film transistor for pixels TC for all of the pixel units PIXs is brought into conduction and an initial voltage such as black, for example, is written to the pixel PIX as a data signal VSIG. Thereafter, the gate all-on control signal GAON and the source all-on control signal SAON are maintained in an active state, and, at the time t4 when the negative power supply voltage VL (negative high voltage) and the positive power supply voltage (positive high voltage) generated in the power supply circuit 150 are fixed, the gate all-on control signal GAON and the source all-on control signal SAON are brought to an non-active state (low level), stopping the all-on operation. Thereafter, at the time t5, the gate start pulse signal GST and the gate clock signals GCK1 and GCK2 are generated, and, at the time t6, a transition is made to the normal operation. In this way, an all-on operation is carried out in a time period in which the power supply voltage is unstable immediately after turning on the power supply, an initial voltage representing black is written into all the pixel units PIXs in this all-on operation, and black is displayed on the whole screen. This makes it possible to suppress image disturbance at the time of turning on the power and alleviate a sense of discomfort that is provided to the viewer.

As the initial voltage of the data signal VSIG, a voltage representing, not only black, but also an arbitrary gray scale can be set.

<Operation for Applying to Off Sequence>

Next, a case is described of applying an all-on operation of the shift register 121 to an off sequence which is carried out when shutting off the power supply of the display apparatus 100.

Figure 6A:
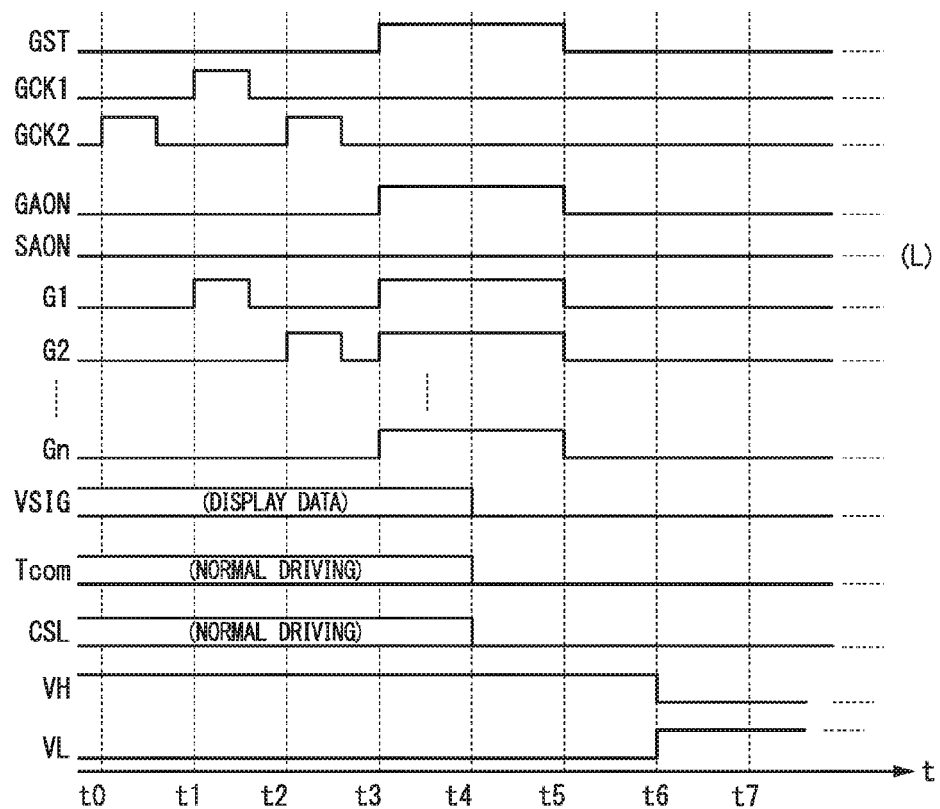
FIG. 6A is a time chart for explaining an exemplary operation in an off sequence of the display apparatus according to the first embodiment.
Figure 6B:
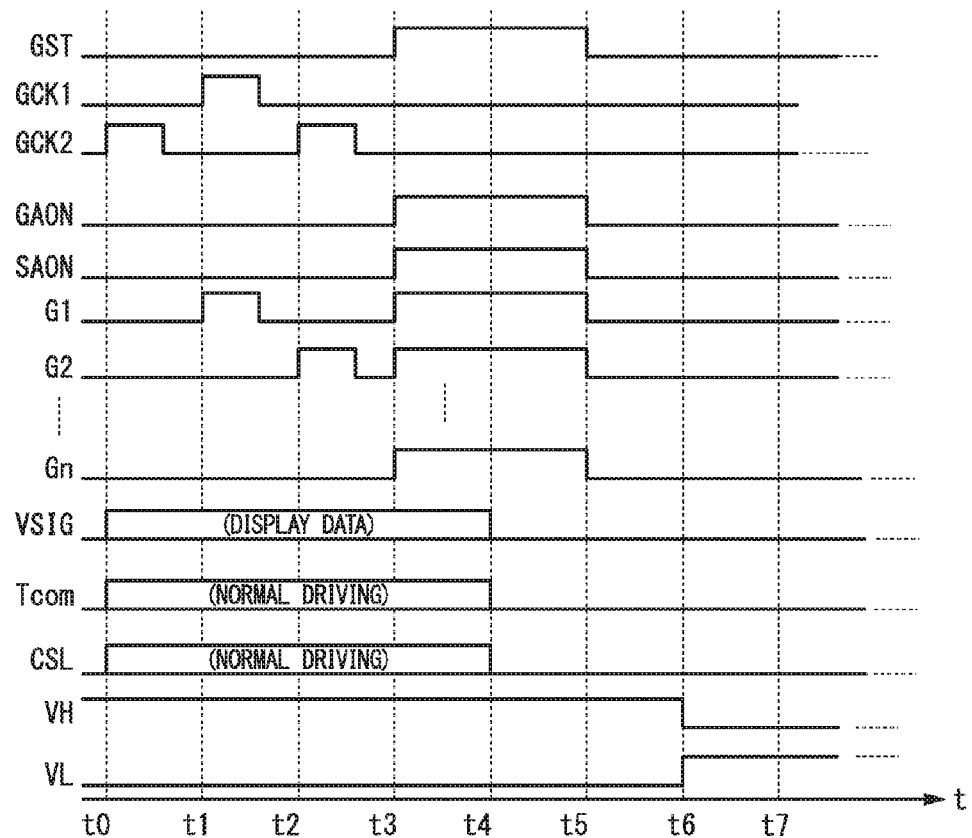
FIG. 6B is a time chart for explaining an exemplary operation in the off sequence of the display apparatus according to the first embodiment.

FIGS. 6A and 6B are time charts for explaining an operation in an off sequence of the display apparatus 100 according to the first embodiment, where FIG. 6A shows an operation when the scan line is controlled to a high level in an all-on operation, while FIG. 6B shows an operation when both the scan line and the signal line are controlled to the high level in the all-on operation.

First, an off sequence in which the scan line is controlled to the high level to carry out the all-on operation is described with reference to FIG. 6A. In this case, the gate all-on control signal GAON is set to the active state, while the source all-on control signal SAON is set to the non-active state. When instructions to shut off the power is provided to the display apparatus 100 or such instructions are produced within the display apparatus 100, the gate all-on control signal GAON is set to a high level in the time t3, which is a predetermined timing for starting the all-on operation. In this case, the shift register 121 of the scan line drive circuit 120 carries out an all-on operation described above, causing all of the gate signals G1, G2, Gn, supplied to the scan lines GL1, GL2, . . . GLn from the shift register 121 to be at a high level. This brings the thin film transistor TC for pixels for all of the pixel units PIXs to be brought into conduction.

Here, in the normal operation at or before the time t3, the display apparatus 100 carries out an image display operation by a dot inverted drive, a scan signal line inverted drive, etc., for example. Therefore, positive charges or negative charges are accumulated on the respective multiple pixel units PIXs connected to the same signal line SL in accordance with the content of displayed images. In other words, of the multiple pixel units PIXs connected to the same signal line SL, positive charges are accumulated to some pixel units PIXs, while negative charges are accumulated to some other pixel units PIXs. Therefore, when the thin film transistors TS1, TS2, . . . , TSn for the signal line selection shown in FIG. 1 are controlled to be all off at the time t3, in an all-on operation time period between the time t3 and the time t5, the positive and negative charges are cancelled out among multiple pixel units PIXs that are connected to the same signal line SL. This allows transitioning to an end state with the display grey scales of all the pixel units PIXs being generally aligned. Therefore, the gray scale of the images displayed by the display apparatus 100 becomes generally uniform at the time of power shutoff, making it possible to suppress image disturbances.

Next, an off sequence is described of controlling both the scan line and the signal line to a high level to carry out an all-on operation. In this case, both the gate all-on control signal GAON and the source all-on control signal SAON are activated. At the time t3, which is a predetermined timing which starts an all-on operation, both the gate all-on control signal GAON and the source all-on control signal SAON are activated, output signals of the shift register 131 of the signal line drive circuit 130 are controlled to a high level at the same time and output signals of the shift register 121 of the scan line drive circuit 120 are brought to a high level at the same time. In this way, in the normal operation at or before the time t3, discharging or charging of the respective pixel units PIX is performed such that the charging states of all pixel units PIXs are aligned in a predetermined state. Therefore, image disturbances at the time of power shutoff may be suppressed more stably, compared to the above-described example shown in FIG. 6A.

<Operation at the Time of Forced Shutoff>

Next, an operation is described for a case in which an operation of the power supply circuit 150 is forcefully stopped by power outage, etc., for example, with an image being displayed on the display unit of the display apparatus 100.

Figure 7:
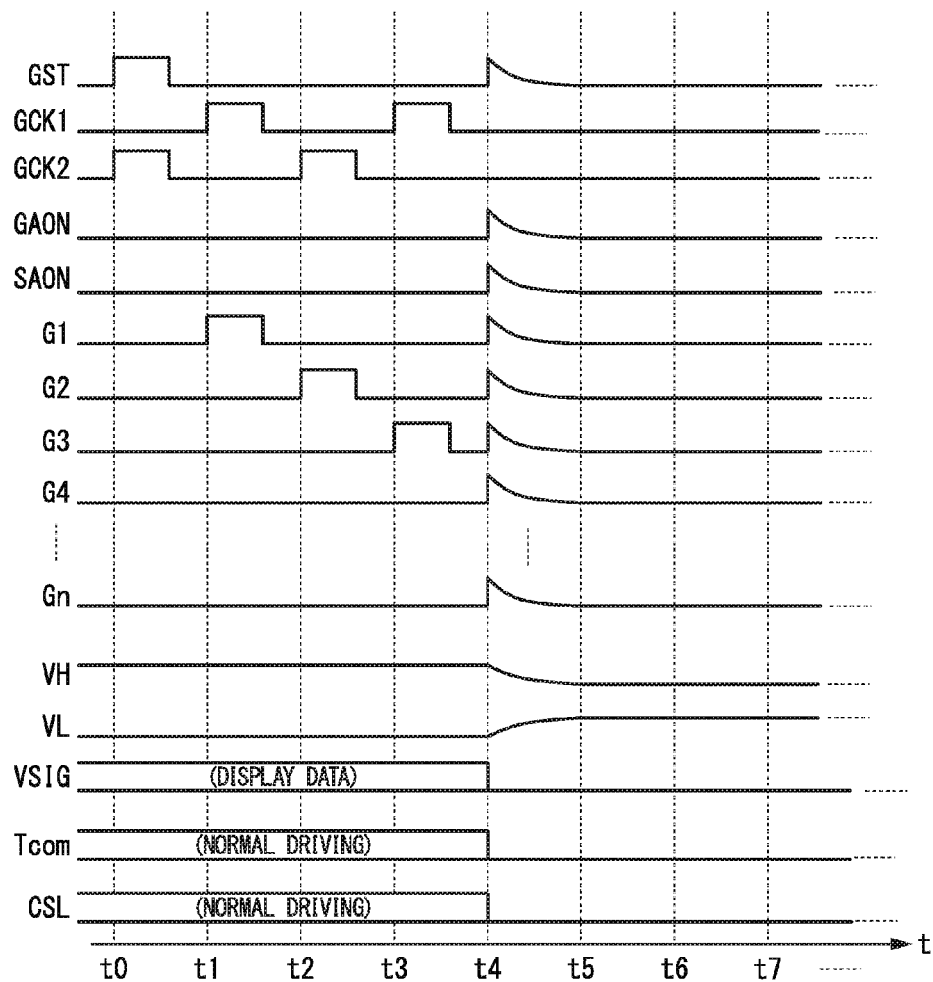
FIG. 7 is a time chart for explaining an exemplary operation at the time of forced shut off of the display apparatus according to the first embodiment.

FIG. 7 is a time chart for describing an operation at the time of the forced shutoff of the display apparatus 100 according to the first embodiment. In the same figure, during the time period between time t0 and time t3, the scan line drive circuit 120 carries out a normal operation. In this case, the gate all-on control signal GAON and the source all-on control signal SAON are all brought to a non-active state (in other words, a low level). With such a normal operation being conducted, when the operation of the power supply circuit 150 is forcefully stopped at the time t4, simultaneously with stopping of the operation of this power supply circuit 150, the display control circuit 140 sets the gate all-on control signal GAON and the source all-on control signal SAON to an active state (in other words, a high level). Here, capacitances C120, C130, etc., are formed in the output wiring of the power supply circuit 150, so that, even when the power supply circuit 150 stops operations, the signal level of the source all-on control signal SAON and the gate all-on control signal GAON that are output by the display control circuit 140 do not reach the ground voltage GSS instantaneously, but gradually decreases to the ground voltage VSS depending on the time constant in accordance with the capacitance of the output wiring of the power supply circuit 150. In this case, the signal level of the other control signal also decreases, so that the gate all-on control signal GAON and the source all-on control signal SAON are relatively maintained at an active state, and an all-on operation is maintained even at or after the time t4.

When the gate all-on control signal GAON and the source all-on control signal SAON are set to the active state (high level) at the time t4, the shift register 121 of the scan line drive circuit 120 carries out the all-on operation, and outputs the high-level output signals OUT1, OUT2, . . . , OUTn to the scan lines GL1, GL2, GLn. Similarly, the shift register 131 of the signal line drive circuit 130 also carries out the all-on operation and outputs the high-level output signal to the signal line SL1, SL2, . . . , SLm. Then, as described above, the capacitances C120, C130, etc., are formed in the output wiring of the power supply circuit 150, so that the positive power supply voltage VH output from the power supply circuit 150 does not reach the level corresponding to the ground voltage VSS instantaneously even if the power supply circuit 150 stops operations, but gradually decreases to the ground voltage VSS depending on the time constant in accordance with the capacitances C120 and C130. In the example shown in FIG. 7, the positive power supply voltage VH of the power supply circuit 150 starts decreasing at the time t4 and decreases to a low level corresponding to the ground potential VSS at the time t5 Similarly, the negative power supply voltage VL which is output from the power supply circuit 150 does not instantaneously reach the negative power supply voltage VL output from the power supply circuit 150, but gradually rises to the ground voltage VSS depending on the time constant in accordance with the capacitance C120 and C130. Moreover, the gate signal G1, G2, G3, . . . , Gn on the scan lines GL1, GL2, . . . , GLn gradually decreases from the time t4 in accordance with the decrease of the positive power voltage VH output from the power supply circuit 150 and reaches a low level corresponding to the ground voltage VSS at the time t5.

In this way, when the power supply circuit 150 is forcefully shut off, the shift register 121 carries out the all-on operation to cause all of the signal levels of scan lines GL1, GL2, . . . , GLn to instantaneously reach a high level and thereafter gradually decreases with a certain time constant. In other words, the signal levels of all of the scan lines GL1, GL2, . . . , GLn are aligned at the same time. In this way, in the same manner as the above-described off sequence, image disturbances are suppressed and a sense of discomfort that is provided to the viewer may be alleviated.

According to the above-described first embodiment, it is not necessary to provide the NMOS transistors Q6 and Q8 that are specifically provided for the above-described related art flow-through current shutoff, so that the number of individual shift registers which make up the scan line drive circuit 120 and the signal line drive circuit 130 may be reduced. Therefore, the layout area of the shift register which includes the scan line drive circuit 120 and the signal line drive circuit 130 may be reduced, making it possible to narrow the frame of the display apparatus 100 which includes the all-on operation function.

Moreover, according to the first embodiment, the thin film transistor T1 (FIG. 3) is turned off at the time of the all-on operation, so that the flow-through current path formed by the thin film transistor T1, the resistor R1, and the thin film transistor T2 is shut off. Moreover, at the time of the all-on operation, the thin film transistor T4 is turned off, so that the flow-through current path which is formed by the thin film transistor T3 and the thin film transistor T4 is shut off. Furthermore, both the thin film transistors T5 and T6 are turned off at the time of the all-on operation, so that the flow-through current path which is formed by the thin film transistors T5 and T6 is also shut off. Therefore, the present embodiment makes it possible to prevent the flow-through current at the all-on operation.

Furthermore, according to the first embodiment, the gate all-on control signal GAONB which is set to a high level is supplied to the gate of the thin film transistor T5 via one thin film transistor T3 at the time of normal operation, making it possible to limit a decrease of the gate voltage of the thin film transistor T5 to a minimum. Therefore, the shift operation of the shift register can be stabilized at the time of normal operations. While a signal level at the time the signal levels of the gate all-on control signal GAON and the source all-on control signal SAON are brought to active is set to a high level in the above-described example, taking into account that all signals converge to the low level (the ground voltage VSS) at the time of power outage, a signal level at the time the signal levels of the gate all-on control signal GAON and the source all-on control signal SAON are brought to active is set to a low level. In this case, with the signal level of the gate all-on control signal GAON and the source all-on control signal SAON being set to the high level at the time of normal operations and the signal level of the gate all-on control signal GAON and the source all-on control signal SAON being set to the low level at the time of forced shutoff, the all-on operation after the forced shutoff can be maintained stably.

Second Embodiment

Next, a second embodiment of the present invention is described.

The second embodiment makes use of FIGS. 1 and 2 that have been used for the first embodiment.

Figure 8:
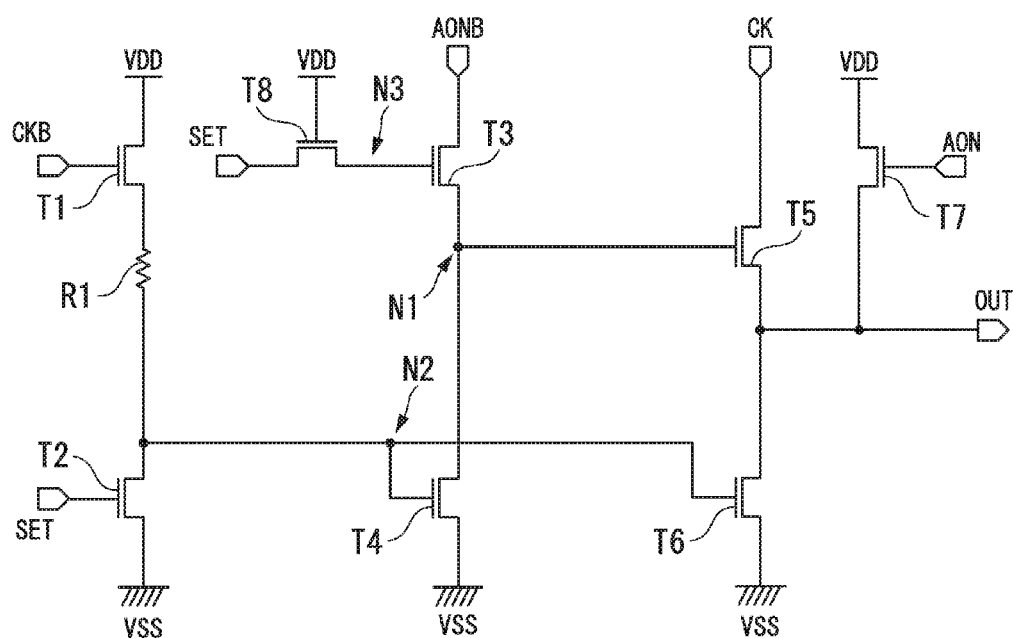
FIG. 8 is a circuit diagram illustrating an exemplary configuration of the shift register unit circuit according to a second embodiment.

In the above-described first embodiment, the display apparatus according to the second embodiment includes a shift register unit circuit 1212 shown in FIG. 8 instead of the shift register unit circuits 121$_1$, 121$_2$, 121$_3$, ..., 121$_n$ (in other words, the shift register unit circuit 1211 as shown in FIG. 3) that make up the shift register 121 shown in FIG. 2 in the above-described first embodiment. The other features are the same as those in the first embodiment.

FIG. 8 is a circuit diagram illustrating an exemplary configuration of the shift register unit circuit 1212 according to the second embodiment. In the configuration of the shift register unit circuit 1211 in the first embodiment shown in FIG. 3, the shift register unit circuit 1212 also includes the thin film transistor T8. The thin film transistor T8 has the current path inserted between the gate of the thin film transistor T3 and the set terminal SET and a power supply voltage VDD (predetermined potential) which provides a signal level to cause the thin film transistor T8 to be turned on is applied to the gate. The connection point between the current path of the thin film transistor T8 and the gate of the thin film transistor T3 forms the node N3. The other features are the same as those of the shift register unit circuit 1211 according to the first embodiment.

In the present embodiment, each of the shift register unit circuits 121$_1$, 121$_2$, 121$_3$, ..., 121$_n$ according to the first embodiment shown in FIG. 2 is replaced with the shift register unit circuit 1212 shown in FIG. 8, but, for convenience of explanations, expressions of "the shift register unit circuits 121$_1$, 121$_2$, 121$_3$, ..., 121$_n$" shown in FIG. 2 are made use of as they are. Thus, according to the present embodiment, each of "shift register unit circuits 121$_1$, 121$_2$, 121$_3$, ..., 121$_n$" refers to the shift register unit circuit 1212 shown in FIG. 8. Except for the eighth embodiment, the same also applies to the below-described respective embodiments.

Next, an operation of the shift register 1212 is described with reference to FIGS. 9A and 9B.

Figure 9A:
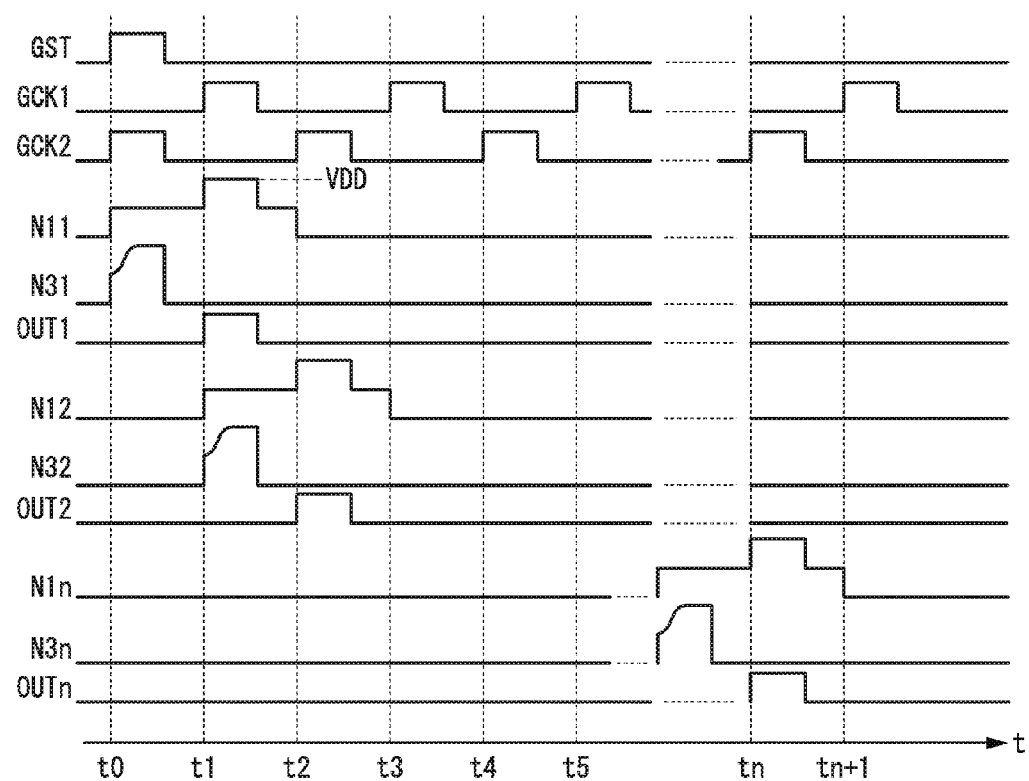
FIG. 9A is a time chart illustrating an exemplary operation of the shift register according to the second embodiment.
Figure 9B:
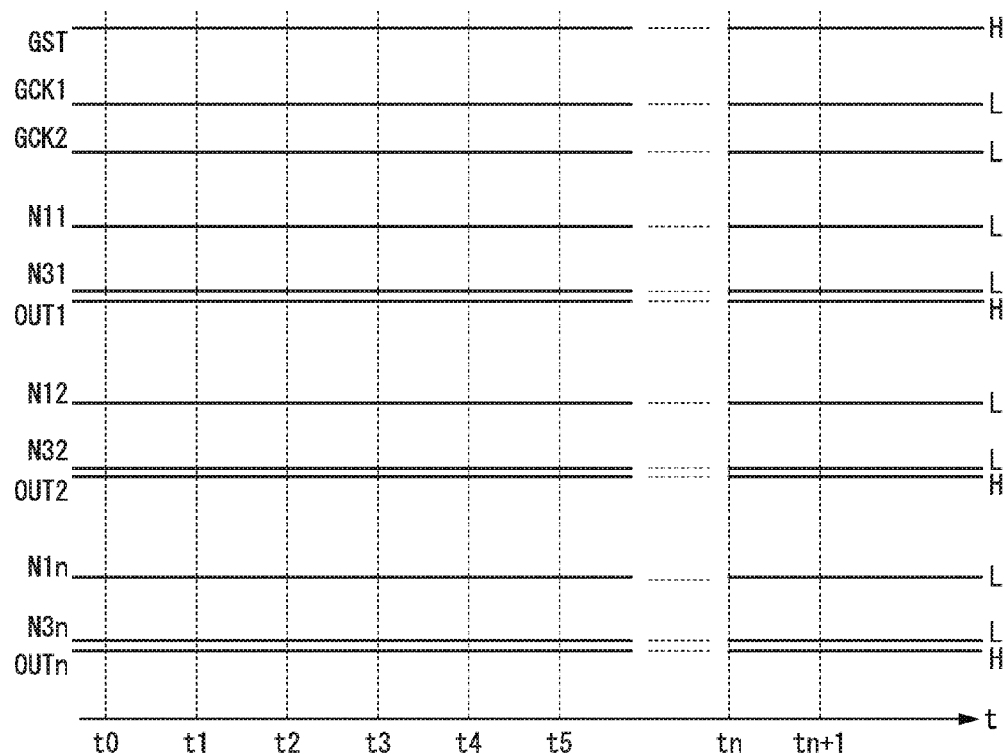
FIG. 9B is a time chart illustrating the exemplary operation of the shift register according to the second embodiment.

FIGS. 9A and 9B are time charts showing an exemplary operation of the shift register 1212 according to the second embodiment, where FIG. 9A is a time chart at the time of normal operation and FIG. 9B is a time chart at the time of all-on operation. In FIGS. 9A and 9B, N11 and N31 refer to the nodes N1 and N3 of the first stage shift register unit circuit 121$_1$, N12 and n32 refer to the nodes N1 and N3 of the second stage shift register unit circuit 121$_2$, N1n and N3n refer to the nodes N1 and N3 of the nth stage shift register unit circuit 121$_n$, and OUT1, OUT2, and OUT n refer to the output signal of the first-stage, second-stage, and nth-stage shift register unit circuits.

"H" shown refers to the high level, while "L" refers to the low level.

First, the normal operation of the shift register 1212 is described with reference to FIG. 9A.

As shown in FIG. 9A, when the gate start pulse signal GST, which is input to the set terminal SET of the first-stage shift register unit circuit 121$_1$ (in other words, the first-stage shift register unit circuit 1212) transition to the high level at the time t0, the signal level of this gate start pulse signal GST is transmitted to the gate of the thin film transistor T3 via the thin film transistor T8. In this way, the node N31 between the thin film transistor T8 and the gate of the thin film transistor T3 is charged and the voltage of this node N31 starts rising.

When the voltage of the node N31 rises, the thin film transistor T3 is turned on. Here, the gate all-on control signal GAONB, which is set to the high level, is provided to the all-on control terminal AONB to which the drain of the thin film transistor T3 is connected, so that, when the thin film transistor T3 is turned on, the source voltage thereof takes a voltage which represents a drop by the threshold voltage Vth from the gate voltage. Thus, the node N11 to which the source of the thin film transistor T3 is connected is charged to follow the node N31 to which the gate of the thin film transistor T3 is connected and the voltage of the node N11 starts rising.

Moreover, when the voltage of the node N31 reaches a voltage which represents a drop by the threshold voltage Vth of the thin film transistor T8 from the gate voltage (power supply voltage VDD) of the thin film transistor T8, the thin film transistor T8 is turned off and the node N31 is brought to a floating state. Thereafter, in the process of the node N11 being charged by the thin film transistor T3 to cause the voltage of the node N11 to rise, the voltage of the node N31 is pushed up by the voltage of the node N11 through the capacitance component between the source and the gate of the thin film transistor T3, the capacitance component between the channel and the gate of the thin film transistor T3, etc.

Here, the larger the capacitance component accompanying the node N11, for example, the gate capacitance of the transistor T5, for example, the slower the rise of the voltage of the node N11 due to charging of the thin film transistor T3, so that the voltage of the node N11 starts rising after the node N31 is brought to the floating state. In this case, the rise of the voltage of the node N11 increases, so that the rise of the voltage of the node N31 which is pushed up by the voltage of the node N11 also increases. In this way, the voltage of the node N31 rises to at least a voltage which is an addition of the threshold voltage Vth of the thin film transistor T3 to the high level (power supply voltage VDD) of the gate all-on control signal GAON, the node N11 is charged to the power supply voltage VDD by the thin film transistor T3 without causing a voltage drop by the threshold voltage Vth of the thin film transistor T3.

Thereafter, when the gate start pulse signal GST input to the set terminal SET transitions from the high level to the low level, the thin film transistor T8 to which one end of the current path is connected to the set terminal SET is turned on. Therefore, the node N31 is discharged by the thin film transistor T8, so that the signal level of the node N31 is brought to the low level. When the signal level of the node N31 is brought to the low level, the thin film transistor T3 whose gate is connected to the node N31 is turned off. At this time, the node N11 is brought to the floating state, and is maintained in a state in which it is charged to the power supply voltage VDD, so that the thin film transistor T5 whose gate is connected to the node N11 is maintained at the on state. Then, at the time t1, when the gate clock signal GCK1 input to the clock terminal CK transitions to the high level, the signal level (high level) of this gate clock signal GCK1 is transmitted to the output terminal OUT via the thin film transistor T5, and a high level is output as the output signal OUT1. The other operations are the same as in the shift register 1211 according to the first embodiment.

The all-on operation is the same as in the above-described first embodiment as shown in FIG. 9B.

In other words, in the all-on operation, the gate all-on control signal GAON is set to the high level and the gate all-on control signal GAONB is set to the low level. Moreover, as shown in FIG. 9B, the gate start pulse signal GST is set to the high level, while the gate clock signals GCK1 and GCK2 are set to the low level. In this case, in the first-stage shift register unit circuit 121$_1$, the thin film transistor T1 is turned off and the thin film transistor T2 is turned on. In this way, the node N21 is pulled down by the thin film transistor T2, and the signal level thereof takes a low level. As a result, the thin film transistors T4 and T6 whose gate is connected to the node N21 are both turned off.

Moreover, the thin film transistor T3 whose gate is connected to the set terminal SET via the thin film transistor T8 is turned on. When the thin film transistor T3 is turned on, the gate all-on control signal GAONB which is set to the low level (ground voltage GSS) is transmitted to the gate of the thin film transistor T5 via the thin film transistor T3. This causes the thin film transistor T5 to be turned off.

Moreover, the thin film transistor T7 whose gate is connected to the all-on control terminal AON to which is provided the gate all-on control signal GAON set to the high level is turned on. When the thin film transistor T7 is turned on, the power supply voltage VDD is supplied to the output terminal via the thin film transistor T7, thereby causing the output terminal OUT to be set to a high level. Here, the thin film transistors T5 and T6 that are connected to the output terminal OUT are both turned off, so that the output terminal OUT is set to the high level by the thin film transistor T7 without being affected by these thin film transistors T5 and T6. This causes the first-stage shift register unit circuit $121_1$ to output the output signal OUT1 at the high level. The second-stage-and-thereafter shift register unit circuits $121_2$, $121_3$, . . . , $121_n$ are also set to the high level in the same manner as the output signal OUT1 of the first-stage shift register unit circuit $121_1$.

In accordance with the above, the scan line drive circuit 120 made of the shift register unit circuit 1212 according to the present embodiment outputs high-level output signals OUT1, OUT2, . . . , OUTn as gate signals G1, G2, . . . , Gn, so that the all-on operation is carried out.

According to the second embodiment, the gate voltage of the thin film transistor T3 becomes higher relative to that in the first embodiment. In this way, a waveform distortion of a signal which is transmitted through a thin film transistor T3 may be suppressed. Therefore, for example, even when the threshold voltage Vth of the thin film transistor rises with effects of the initial characteristics, the temperature characteristics, deterioration, etc., degradation of the signal within the shift register may be suppressed and the operating margin of the shift register may be improved.

Third Embodiment

Next, the third embodiment of the present invention is described.

Even in the present embodiment, FIGS. 1 and 2 that have been used in the first embodiment are made use of.

Figure 10:
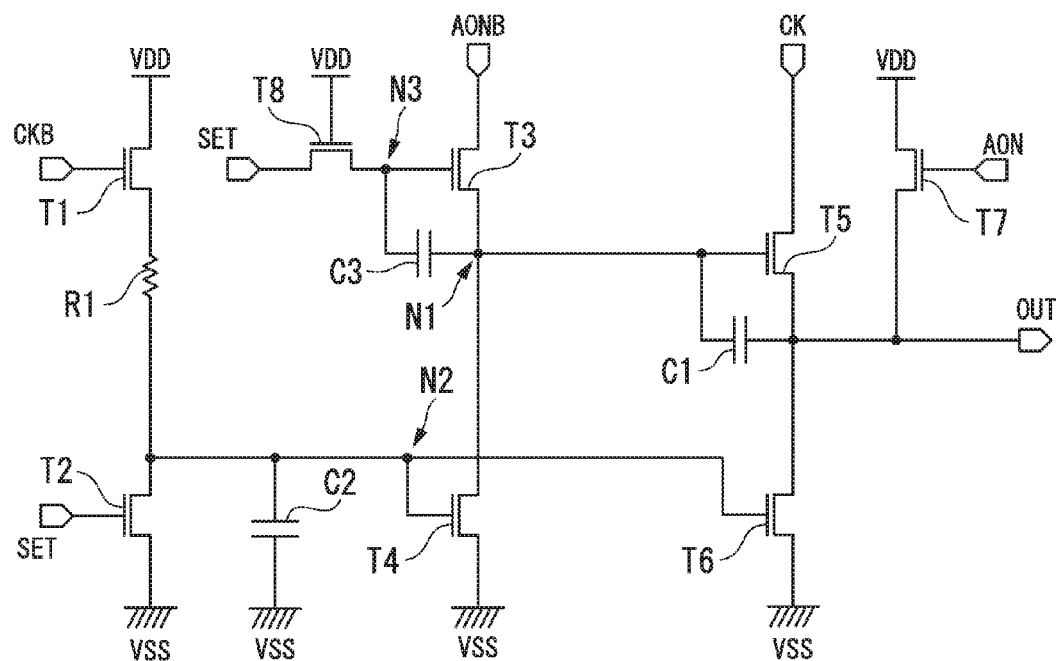
FIG. 10 is a circuit diagram illustrating an exemplary configuration of the shift register unit circuit according to a third embodiment.

A display apparatus according to the third embodiment includes a shift register unit circuit 1213 shown in FIG. 10 instead of the shift register unit circuits $12_1$, $12_2$, $12_3$, . . . , $121_n$ (in other words, the shift register unit circuit 1211 as shown in FIG. 3) that make up the shift register 121 shown in FIG. 2, which is made use of in the above-described second embodiment. The other features are the same as those for the second embodiment.

FIG. 10 is a circuit diagram showing an exemplary configuration of the shift register unit 1213 according to the third embodiment. In the configuration of the shift register unit circuit 1212 according to the second embodiment shown in FIG. 8, the shift register unit circuit 1213 further includes the capacitors C1, C2, and C3. The capacitor C1 is connected between the drain and the gate of the thin film transistor T5. The capacitor C3 is connected between the drain and the gate of the thin film transistor T3. The capacitor C2 is connected between the grand node (predetermined potential node) and the node N2 to which each gate of the thin film transistors T4 and T6 are connected. The other features are the same as in the shift register unit circuit 1212 in the second embodiment.

Not all of capacitors C1, C2, and C3 need to be included and only one or two arbitrary ones thereof need to be included.

While the basic operations are the same as those in the shift register unit circuit 1212 according to the above-described second embodiment, the self-bootstrap effect of the thin film transistor T5 in the normal operations may be enhanced by the capacitor C1 in the present embodiment. This makes it possible to effectively increase the gate voltage of the thin film transistor T5 when the thin film transistor T5 is turned on. Thus, without compromising the signal level transmitted to the output terminal OUT from the clock terminal CK via the thin film transistor T5, the signal level thereof may be transmitted to the output terminal OUT.

Moreover, the self-bootstrap effect of the thin film transistor T3 may be increased by the capacitor C3. The gate voltage of the thin film transistor T3 may be effectively increased thereby when the thin film transistor T3 is turned on. Therefore, it may be transmitted without compromising the signal level from the all-on control terminal AONB to the node N1 via the thin film transistor T3.

Moreover, the holding capability of the voltage of the node N2 may be increased by the capacitor C2. This may stably maintain the thin film transistors T4 and T6 in an off state during the time the node N1 is being charged, stabilizing the shift operation.

According to the present embodiment, an increase in voltage of the node N1 or the node N3 due to the bootstrap effect may be improved compared to the second embodiment, making it possible to stably control the thin film transistors T3 and T5 to be on. This, it is possible to improve the operating margin of the shift register.

For the all-on operation, it is the same as that in the above-described first and second embodiments.

Fourth Embodiment

Next, the fourth embodiment of the present invention is described.

Even in the present embodiment, FIGS. 1 and 2, which have been used in the first embodiment, are made use of.

Figure 11:
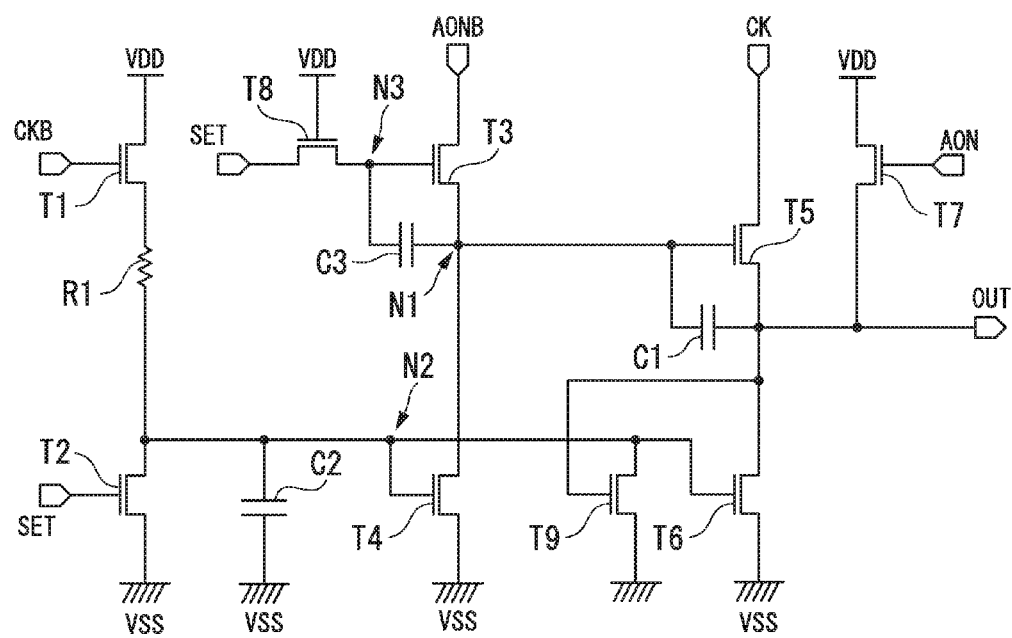
FIG. 11 is a circuit diagram illustrating an exemplary configuration of the shift register unit circuit according to a fourth embodiment.

A display apparatus according to the fourth embodiment includes a shift register unit circuit 1214 shown in FIG. 11 instead of the shift register unit circuits $121_1$, $121_2$, $121_3$, . . . , $121_n$ (in other words, the shift register unit circuit $121_1$ shown in FIG. 3) which make up the shift register 121 shown in FIG. 2, which is made use of in the above-described third embodiment.

FIG. 11 is a circuit diagram showing an exemplary configuration of the shift register unit circuit 1214 according to the fourth embodiment. In the configuration of the shift register unit circuit 1213 in the third embodiment shown in FIG. 10, the shift register unit circuit 1214 further includes the thin film transistor T9. The thin film transistor T9 has the gate thereof connected to the drain of the thin film transistor T6, the drain thereof connected to the gate of the thin film transistor T6, and the source thereof connected to the grand node (predetermined potential node). In other words, the thin film transistor T6 and the thin film transistor T9 have the gate and the drain thereof cross-coupled. The other features are the same as the shift register unit circuit 1213 in the third embodiment.

While the basic operation is the same as the shift register unit circuit 1212 according to the above-described third embodiment, the high level of the output signal of the output terminal OUT may be stably maintained in the time period from the time t1 to the time t2 that are shown in FIG. 9A according to the second embodiment. This is explained by making use of the time chart in FIG. 9A. In the normal operation, when the gate start pulse signal GST and the gate clock signal GCK2 transition to the high level at the time t0, the thin film transistors T1 and T2 are turned on as described above, and, of these, the thin film transistor T2 causes the node N2 to be driven to the low level. Thereafter, when the gate start pulse signal GST and the gate clock signal GCK2 transition to the low level, the thin film transistors T1 and T2 are turned off and the node N2 is brought to the floating state. In this way, the signal level up to then (in other words, the low level) of the node N2 is held by the capacitance formed in the node N2 (for example, the capacitance of the capacitor C2, etc.). Moreover, when the gate clock signal GCK1 transitions to the high level at the time t1, the high level is output to the output terminal OUT through the thin film transistor T5 as described above.

Here, in the time period from the time t1 during which the high level is output to the output terminal OUT via the thin film transistor T5, the thin film transistor T6 needs to be maintained at an off state. On this point, in the above-described first to third embodiments, the node N2 to which the gate of the thin film transistor T6 is connected is maintained at a floating state in the time period during which the output signal of the output terminal OUT is brought to a high level from the time t1, so that the signal level of the gate of the thin film transistor T6 is maintained at the low level by the capacitance formed in the node N2. Therefore, when the signal level of the node N2 rises due to the presence of noise or a leak path, for example, the thin film transistor T6 could be brought to the on state to pull down the signal level (high level) of the output terminal OUT.

On the other hand, in the fourth embodiment, when the signal level of the output terminal OUT is brought to the high level by the presence of the above-described noise or leak path, the signal level of the gate of the thin film transistor T9 is brought to the high level. Therefore, the thin film transistor T9 is turned on, driving the node N2 to which the gate of the thin film transistor T6 is connected to the low level (ground voltage VSS). In this way, in the time period during which the signal level of the output terminal OUT is brought to the high level from the time t1, the thin film transistor T6 is forcefully maintained at an off state by the thin film transistor T9. Therefore, according to the present embodiment, in the normal operations, an output signal may be stably maintained at the high level and a misoperation due to decreasing of the signal level of the output signal may be prevented. Therefore, an operating margin of the shift register can be improved.

For the all-on operations, the same applies as in the above-described first to third embodiments.

Fifth Embodiment

Next, a fifth embodiment of the present invention is described.

Even in the present embodiment, FIGS. 1 and 2 that have been used in the first embodiment are made use of.

Figure 12:
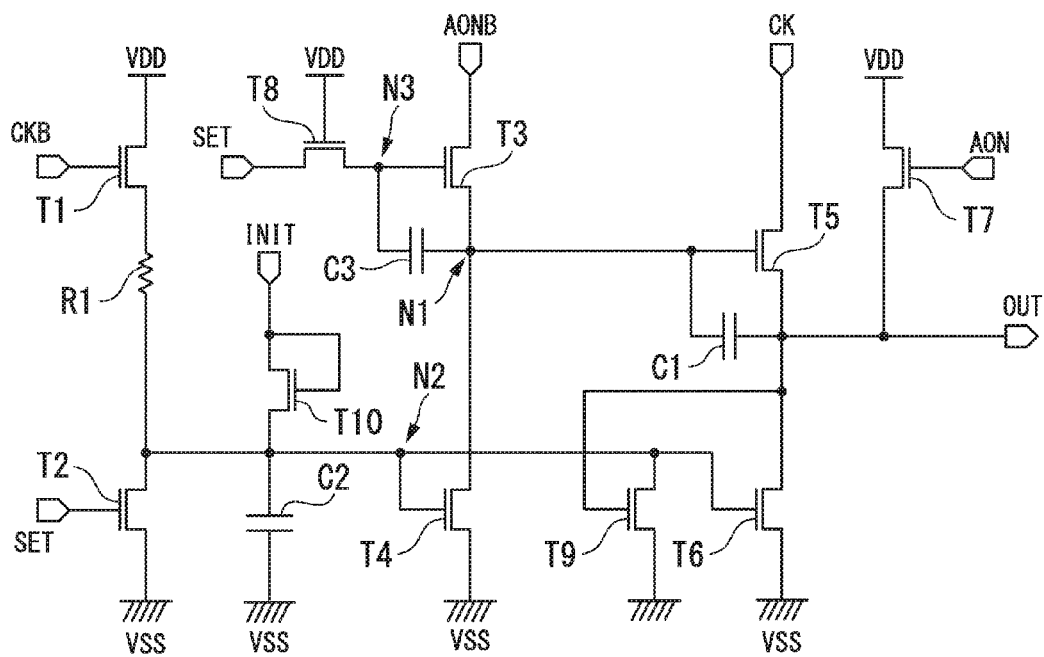
FIG. 12 is a circuit diagram illustrating an exemplary configuration of the shift register unit circuit according to a fifth embodiment.

The display apparatus according to the fifth embodiment includes a shift register unit circuit 1215 shown in FIG. 12 instead of the shift register unit circuits $121_1$, $121_2$, $121_3$, . . . , $121_n$ (in other words, the shift register unit circuit 1211 shown in FIG. 3) which make up the shift register 121 shown in FIG. 2, which is made use of in the above-described fourth embodiment. The other features are the same as in the fourth embodiment.

FIG. 12 is a circuit diagram illustrating an exemplary configuration of the shift register unit circuit 1215 in the fifth embodiment. In the configuration of the shift register unit circuit 1214 in the fourth embodiment shown in FIG. 11, the shift register unit circuit 1215 further includes a thin film transistor T10. The thin film transistor T10 has the source thereof connected to the node N2 to which are connected the gate of each of the thin film transistor T6 and the thin film transistor T4 and has an initialization signal INIT applied to the gate and the drain of the thin film transistor T10. In other words, the thin film transistor T10 is provided in a diode connection, the initialization signal INIT is provided to a node which corresponds to an anode thereof, and a node corresponding to a cathode thereof is connected to the node H2 to which each gate of the thin film transistors T4 and T6 is connected. The other features are the same as those in the shift register unit circuit 1214 in the fourth embodiment.

The initialization signal INIT is a signal which is set to an active state (high level) by the display control circuit 140, for example, at the time of turning on the power, at the time of turning off the power, or when the shift register is initialized for the time being. In the all-on operation, the initialization signal INIT is set to a non-active state (low level). When the initialization signal INIT is activated, the voltage of the drain and the gate of the thin film transistor T10 rise and a voltage is produced, which is a voltage corresponding to a drop by the threshold voltage Vth from the drain voltage thereof. For example, assuming the high level of the initialization signal INIT of the power supply voltage VDD, a voltage (VDD−Vth) is produced which is a drop by the threshold voltage Vth of the thin film transistor T10 from the power source voltage VDD. When the source voltage (VDD−Vth) of the thin film transistor T10 is provided to the node N2, the thin film transistors T4 and T6 are forcefully turned on. Thus, the node 1 is discharged by the thin film transistor T4, while the output terminal OUT is pulled down by the thin film transistor T6. As a result, the circuit state of the shift register unit circuit 1215 is initialized and the signal level of the output signal is initialized.

The present embodiment may actively control the initialization signal INIT to initialize the circuit state of the shift register from the configuration point of view regardless of a signal input to the clock terminals CK and CKB, the set terminal SET, etc., and stably control the shift register to a non-active state and set the output signal to the low level. While the present embodiment is configured to have the thin film transistor T10 in a diode connection, it may be configured such that the drain of the thin film T10 is fixed to the power supply voltage VDD and the initialization signal INIT is input to the gate thereof.

The all-on operations are the same as those in the first to fourth embodiments described above.

Sixth Embodiment

Next, a sixth embodiment of the present invention is described.

Even in the present embodiment, FIGS. 1 and 2 used in the first embodiment are made use of.

Figure 13:
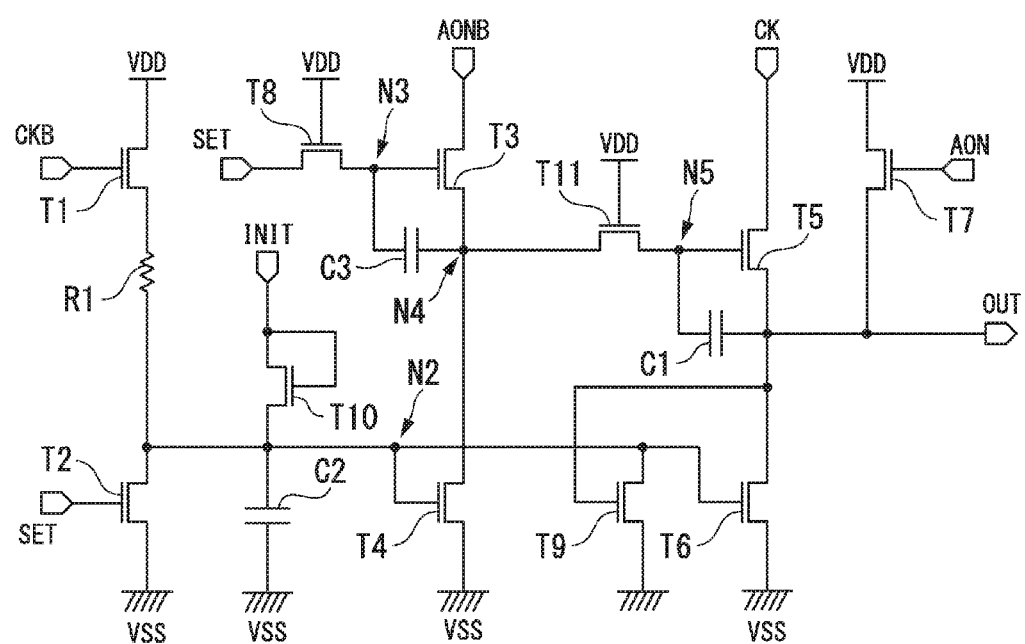
FIG. 13 is a circuit diagram illustrating an exemplary configuration of the shift register unit circuit according to a sixth embodiment.

The display apparatus according to the sixth embodiment includes a shift register unit circuit 1216 shown in FIG. 13 instead of the shift register unit circuit $121_1$, $121_2$, $121_3$, . . . , $121_n$ (in other words, the shift register unit circuit 1211 shown in FIG. 3) which make up the shift register 121 shown in FIG. 2 for which use is made of in the above-described fifth embodiment. The other features are the same as in the fifth embodiment.

FIG. 13 is a circuit diagram which shows an exemplary configuration of the shift register unit circuit 1216 according to the sixth embodiment. In the configuration of the shift register unit circuit 1215 in the fifth embodiment shown in FIG. 12, the shift register unit circuit 1216 further includes the thin film transistor T11. The thin film transistor T11 has a current path thereof being inserted between the drain of the thin film transistor T3 and the gate of the thin film transistor T5. More specifically, one of the source and the drain that form the current path of the thin film transistor T11 is connected to the source of the thin film transistor T3 and the other of the source and the drain of the thin film transistor t11 is connected to the gate of the thin film transistor T5. A power supply voltage VDD (predetermined potential) is applied to the gate of the thin film transistor T11. In the present embodiment, a connection point between the source of the thin film transistor T3 and the drain of the thin film transistor T4 forms the node N4, while a connection point between a current path of the thin film transistor T11 and the gate of the thin film transistor T5 forms the node N5. The other features are the same as in the shift register unit circuit 1215 in the fifth embodiment.

According to the above-described shift register unit circuit 1215 in the fifth embodiment, when the voltage of the node N1 is pushed up by the bootstrap effect by the capacitor C1, the voltage is brought to a high voltage (VDD+α), which is higher than the power supply voltage VDD. Then, coupled with the bootstrap effect by the capacitor C3, a differential voltage of the high voltage (VDD+α) and the ground voltage GSS are applied between the gate and the drain and between the source and the drain of the thin film transistor T3, leading to a state in which quite a high voltage is applied. The same applies for the thin film transistor T4, so that a differential voltage of the high voltage (VDD+α) and the ground voltage GSS is also applied between the gate and the drain and between the source and the drain of the thin film transistor T4. Such a high voltage may be a cause for degradation of a transistor, etc., for example. In the sixth embodiment, as described in the following, occurrence of the above-described high voltage in the fifth embodiment is prevented by the thin film transistor T11 in the operation of the shift register unit circuit 1216.

An operation of the shift register unit circuit 1216 according to the present embodiment is described.

Figure 14A:
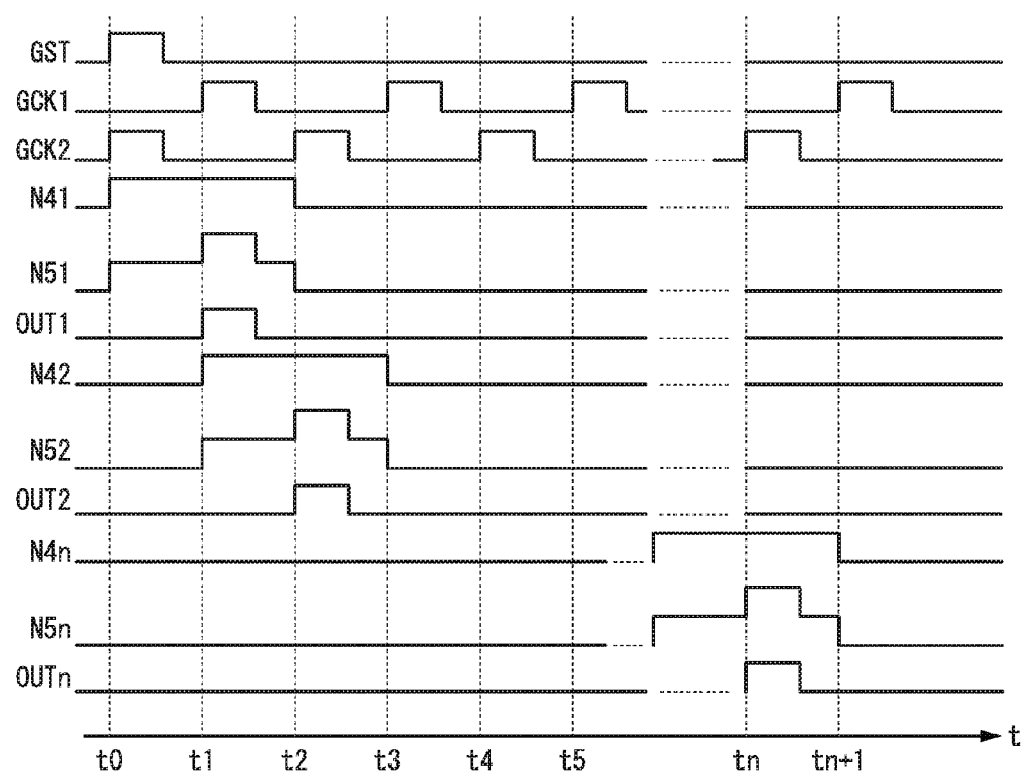
FIG. 14A is a time chart illustrating an exemplary operation of the shift register according to the sixth embodiment.
Figure 14B:
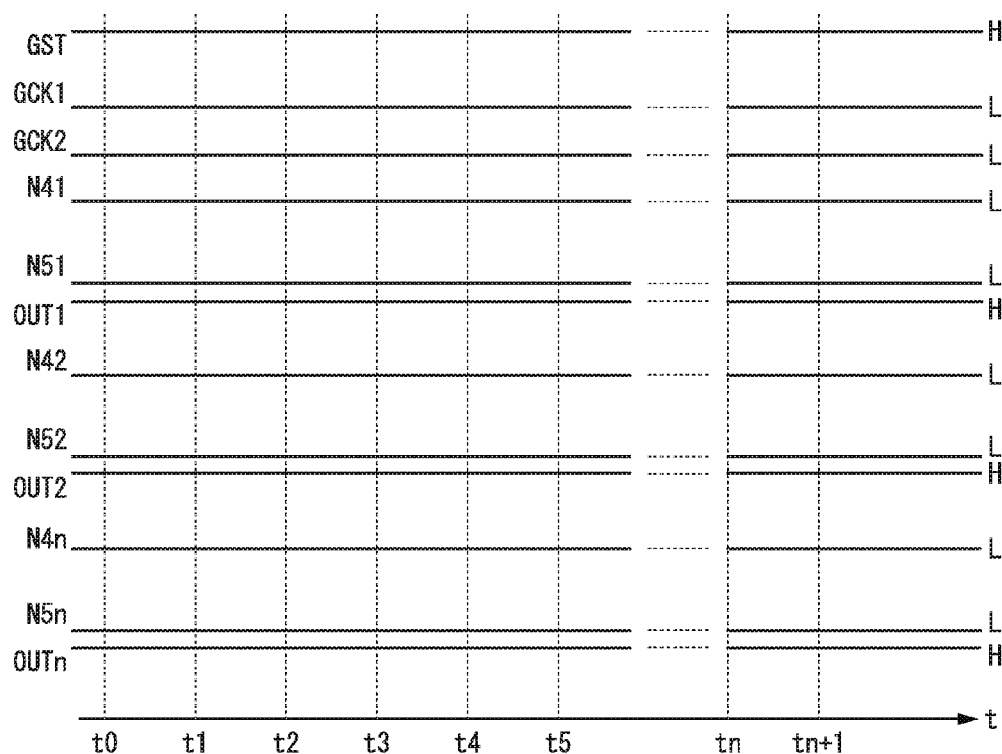
FIG. 14B is a time chart illustrating an exemplary operation of the shift register according to the sixth embodiment.

FIGS. 14A and 14B are time charts showing exemplary operations of the shift register 121 including the shift register unit circuit 1216 according to the sixth embodiment, where FIG. 14A is a time chart at the time of normal operations and FIG. 14B is a time chart at the time of all-on operations. In FIGS. 14A and 14B, the high level and the low level of the gate start pulse signal GST and the gate clock signals GCK1 and GCK2 are respectively signal levels corresponding to the ground voltage VSS and voltage VDD of the operation power supply supplied to the shift register. Moreover, in the normal operation, the gate all-on control signal GAON is set to the low level, while the gate all-control signal GAONB is set to the high level. Moreover, in FIGS. 14A and 14B, N41 and NM represent nodes N4 and N5 of the first-stage shift register unit circuit 121₁, N42 and N52 show nodes N4 and N5 of the second-stage shift register unit circuit 121₂, N4*n* and N5*n* represent nodes N4 and N5 of the n-th stage shift register unit circuit 121ₙ, and OUT1, OUT2, and OUTn respectively represent an output signal of first-stage, second-stage, and n-th stage shift register unit circuits.

"H" shown represents a high level, while "L" represents a low level.

First, normal operations of the shift register 1216 is explained with reference to FIG. 14A.

While the basic operation of the shift register unit circuit 1216 is equivalent to the normal operations of the respective shift register unit circuits 1216 according to the above-described first to fifth embodiments, the sixth embodiment is different from the above-described respective embodiments in that the behavior of the internal signal when the node N4 is charged to output the high level as an output signal is different from the above-described individual embodiments.

As shown in FIG. 14A, when the gate start pulse signal GST, which is input to the set terminal SET of the first-stage shift register unit circuit 1211 (in other words, the first-stage shift register unit circuit 1216), transitions to the high level at the time t0, the signal level of this gate start pulse signal GST is transmitted to the gate of the thin film transistor T3 through the thin film transistor T8. In this way, the node N31 between the thin film transistor T8 and the gate of the thin film transistor T3 is charged and the voltage of this node N31 starts rising.

When the voltage of the node N31 rises, the thin film transistor T3 is turned on. Here, the gate all-on control signal GAONB which is set to the high-level is provided to the all-on control terminal AONB to which the drain of the thin film transistor T3 is connected, so that, when the thin film transistor T3 is turned on, the source voltage thereof is brought to a voltage which represents a drop by the threshold voltage Vth from the gate voltage. Therefore, the node N41 to which the source of the thin film transistor T3 is charged to follow the node N31 to which the gate of the thin film transistor T3 is connected, and the voltage of the node N41 starts rising.

Moreover, when the voltage of the node N31 reaches the voltage which represents the drop by the threshold voltage Vth of the thin film transistor T8 from the power supply voltage VDD, the thin film transistor T8 is turned off and the node N31 is brought to the floating state. Thereafter, in the process that the node N41 is charged by the thin film transistor T3 to cause the voltage of the node N41 to rise, the voltage of the node N31 is pushed up by the voltage of the node N41 via the capacitor C3.

When the voltage of the node N31 rises and is brought to a voltage which is an addition of the threshold voltage Vth of the thin film transistor T3 to the power supply voltage VDD, the node N41 is charged to the power supply VDD by the thin film transistor T3 without causing a voltage drop by the threshold voltage Vth of the thin film transistor T3. Here, the power supply voltage VDD is applied to the gate of the thin film transistor T11 and the thin film transistor T11 is in an on state, so that, when the node N41 is charged, the node NM is also charged via the thin film transistor T11 and the signal level of the node N51 rises. Therefore, the thin film transistor T5 whose gate is connected to the node N51 is turned on.

At this time, the signal level of the gate clock signal CK1 input to the drain of the thin film transistor T5, which is connected to the clock terminal CK, is at a low level, so that the signal level of the output signal of the output terminal OUT1 is kept at the low level. When the node N5 is charged to the voltage which represents a drop by the threshold voltage Vth of the thin film transistor T11 from the power supply voltage VDD through the thin film transistor T11, the thin film transistor T11 is turned off and the node N41 and the node N51 are electrically detached.

Next, when the gate clock signal GCK1 which is input to the clock terminal CK transitions to the high level at the time t1, the signal level (high level) of this gate clock signal GCK1 is transmitted to the output terminal OUT through the thin film transistor T5 and the high level is output as the output signal OUT1. Then, due to the bootstrap effect by the capacitor C1, the voltage of the node NM is pushed up by the voltage of the output signal of the output terminal OUT to be brought to a high voltage. In this way, the high level (power supply voltage VDD) of the gate clock signal GCK1 input to the clock terminal CK is transmitted to the output terminal OUT without causing a voltage drop by the threshold voltage Vth of the thin film transistor T5.

Here, even when the voltage of the node N51 rises by the bootstrap effect due to the capacitor C1, the thin transistor T1 is turned off, so that the voltage of the node N41 is not pushed up by the bootstrap effect by this capacitor C1 and the voltage of the node n41 is maintained at the power supply voltage VDD. Thus, according to the present embodiment, only the differential voltage of the power supply voltage VDD and the ground voltage VSS is applied to the thin film transistors T3 and T4, so that the high voltage is not applied.

Moreover, the voltage of the node N51 is kept to a voltage (VDD−Vth+α) which is an addition of the voltage α corresponding to a rise in voltage by the capacitor C1 and the voltage which represents a subtraction of the threshold voltage Vth of the thin film transistor T1 from the voltage of the node N41. Thus, only the differential voltage (α-Vth) of the voltage (VDD−Vth+a) of the node N51 and the voltage (VDD) of the node N41 is applied to the thin film transistor T11. Moreover, the voltage α which corresponds to the rise due to the bootstrap effect by the capacitor C1 is not brought to be larger than the amplitude (VDD−VSS) of the gate clock signal GCK1 input to the clock terminal CK, so that only the voltage which is less than or equal to the normal drive voltage is applied to the thin film transistor T5.

The other normal operations are the same as each of the above-described embodiments.

The all-on operation is the same as in the above-described individual embodiments as shown in FIG. 14B.

In other words, in the all-on operation, the gate all-on control signal GAON is set to the high level and the gate all-on control signal GAONB is set to the low level. Moreover, as shown in FIG. 14B, the gate start pulse signal GST is set to the high level, while the gate clock signal GCK1 and GCK2 are set to the low level. In this case, in the first-stage shift register unit circuit $121_1$, the thin transistor T1 is tuned off and the thin film transistor T2 is turned on. In this way, the node N21 is pulled down by the thin film transistor T2, and the signal level thereof is brought to the low level. As a result, the thin film transistors T4 and T6 whose gate is connected to the node N21 is turned off.

Moreover, the thin film transistor T3 whose gate is connected to the set terminal SET is turned on. When the thin film transistor T3 is turned on, the gate all-on control signal GAONB which is set to the low level is transmitted to the gate of the thin film transistor T5 through the thin film transistor T3 and the thin film transistor T11. In this way, the thin film transistor T5 is turned off.

Moreover, the thin film transistor T7 whose gate is connected to the all-on control terminal AON to which is provided the gate all-on control signal GAON set to the high level is turned on. When the thin film transistor T7 is turned on, the power supply voltage VDD is supplied to the output terminal OUT through the thin film transistor T7 and the output terminal OUT is set to the high level. In this way, the first-stage shift register unit circuit $121_1$ outputs a high-level output signal OUT1. Output signals OUT2, OUT3, . . . , OUTn of the second-stage-and-thereafter shift register unit circuits $121_2$, $121_3$, . . . , $121_n$ are also similarly set to the high level in the same manner as the output signal OUT 1 of the first-stage shift register unit circuit $121_1$.

As described above, the shift register 121 which is made of the shift register unit circuit 1216 according to the present embodiment outputs output signals OUT1, OUT2, . . . , OUTn as the gate signal G1, G2, . . . , Gn at the high level and carries out the all-on operation.

According to the sixth embodiment, compared to the fifth embodiment, a voltage applied to the individual thin film transistors is alleviated, making it possible to suppress degradation, etc., of the transistor.

Seventh Embodiment

Next, a seventh embodiment of the present invention is described.

Even in the present embodiment, FIGS. 1 and 2, which have been used in the first embodiment, is used.

Figure 15:
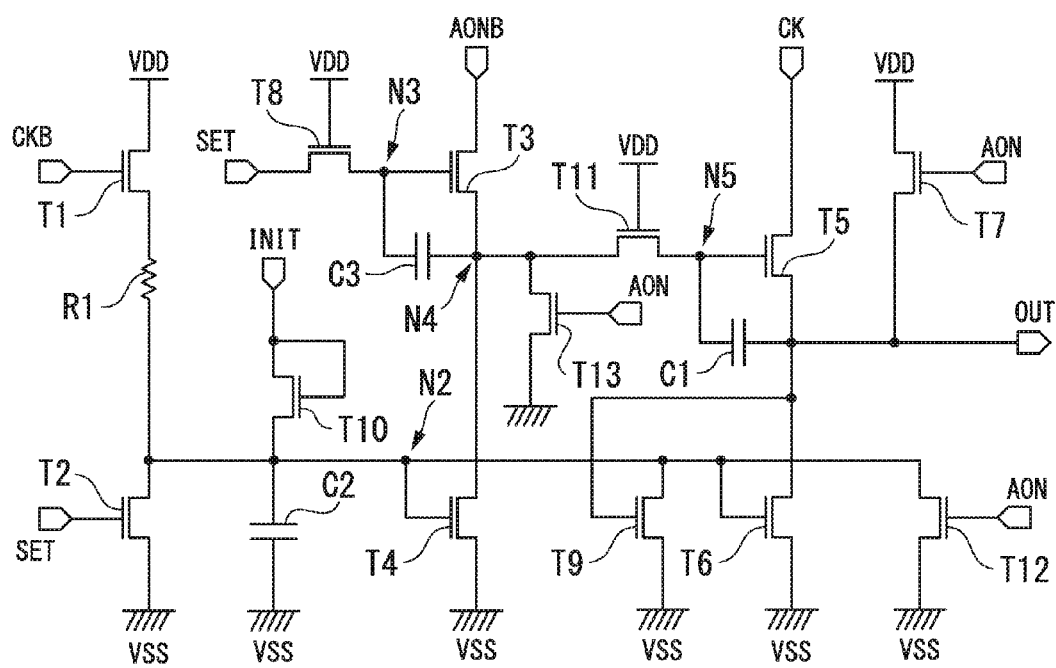
FIG. 15 is a circuit diagram illustrating an exemplary configuration of the shift register unit circuit according to a seventh embodiment.

The display apparatus according to the seventh embodiment includes a shift register unit circuit 1217 shown in FIG. 15, instead of the shift register unit circuits $121_1$, $121_2$, $121_3$, . . . , $121_n$ (in other words, the shift register unit circuit $121_1$ shown in FIG. 3) which makes up the shift register 121 shown in FIG. 2 for which use is made of in the above-described sixth embodiment. The other features are the same as in the sixth embodiment.

FIG. 15 is a circuit diagram showing an exemplary configuration of the shift register unit circuit 1217 according to the seventh embodiment. In the configuration of the shift register unit circuit 1216 in the sixth embodiment shown in FIG. 13, the shift register unit circuit further includes the thin film transistors T12 and T13. The thin film transistor T12 has the current path thereof connected between the grand node (predetermined potential node) and the node N2 to which the gate of the thin film transistor T6 is connected. Moreover, the gate of the thin film transistor T12 is connected to the all-on control terminal AON and the gate all-on control signal GAON is applied to the gate thereof.

The thin film transistor T13 has a current path thereof being connected between the grand node (predetermined potential node) and the node N4 to which the source of the thin film transistor T3 is connected. Moreover, the gate of the thin film transistor T13 is connected to the all-on control terminal AON and the gate all-on control signal GAON is supplied to the gate thereof. The other features are the same as the shift register unit circuit 1216 according to the sixth embodiment.

Next, an operation of the shift register unit circuit 1217 according to the present embodiment is described.

In the present embodiment, the normal operation is the same as the above-described sixth embodiment, so that repeated explanations are omitted and the all-on operation is described.

In the all-on operation, the gate all-on control signal GAON is set to the high level, while the gate all-on control signal GAONB, which is an inverted signal thereof, is set to the low level. Moreover, the gate clock signals GCK1 and GCK2 are set to the low level. The gate start pulse signal GST may be a high level or a low level.

When the gate start pulse signal GST input to the set terminal SET is at a high level, in the same manner as the above-described individual embodiments, the thin film transistor T2 is turned on and the node N2 is discharged by this thin film transistor T2. In this case, the thin film transistor T12 whose gate is connected to the all-on control terminal AON is also turned on, so that the node N2 is discharged via this thin film transistor T12 along with the thin film transistor T2. In this way, the thin film transistors T4 and T6 whose gate is connected to the node N2 are controlled to be in an off state.

Moreover, the high level of the gate start pulse signal GST input to the set terminal SET is provided to the gate of the thin film transistor T3 through the thin film transistor T8.

In this way, the thin film transistor T3 is turned on. Here, the low-level gate all-on control signal GAONB is input to the all-on control terminal AONB to which the drain of the thin film transistor T3 is connected, so that the low level of this gate all-on control signal GAONB is transmitted to the node N4 via the thin film transistor T3. In this way, the node N4 is discharged via the thin film transistor T3.

In this case, the thin film transistor T13 whose gate is connected to the all-on control terminal AON is also turned on, so that the node N4 is discharged through the thin film transistor T13 together with the thin film transistor T3. The low level of the node N4 discharged is transmitted to the gate of the thin film transistor T5 through the thin film transistor T11, thereby causing the thin film transistor T5 to be turned off. As a result, both of the thin film transistors T5 and T6 that are connected to the output terminal OUT are turned off.

On the other hand, the thin film transistor T7 whose gate is connected to the all-on control terminal AON to which is provided the gate all-on control signal GAON set to the high level is turned on. When the thin film transistor T7 is turned on, the power supply voltage VDD is supplied to the output terminal OUT via the thin film transistor T7 and the output terminal OUT is set to the high level. In this way, the first-stage shift register unit circuit $121_1$ outputs the output signal OUT1 at the high level. The output signals OUT2, OUT3, . . . , OUTn of the second-stage-and-thereafter shift register unit circuits $121_2$, $121_3$, . . . , $121_n$ also are set to the high level in the same manner as the output signal OUT1 of the first-stage shift register unit circuit $121_1$. In this way, the all-on operation when the gate start pulse signal GST is set to the high level is carried out.

Next, when the gate start pulse signal GST input to the set terminal SET is at the low level, the thin film transistor T2 whose gate is connected to the set terminal SET is turned off. Moreover, the thin film transistor T3 whose gate is connected to the set terminal SET via the thin film transistor T8 is also turned off. However, the thin film transistors T12 and T13 whose gate is provided with the gate all-on control signal GAON at the high level are both turned on, so that the node N4 is discharged by the thin film transistor T13. Thus, as far as the thin film transistors T4, T5, T6, T9, and T11 are concerned, the circuit state is brought to be the same as in a case in which the above-described gate start pulse signal GST is at the high level.

As a result, in the same manner as the above-described individual embodiments, when the thin film transistor T7 whose gate is connected to the all-on control terminal AON to which is provided the gate all-on control signal set to the high level is turned on, the power supply voltage VDD is supplied to the output terminal OUT via the thin film transistor T7 and the output terminal OUT is set to the high level. In this way, the first-stage shift register unit circuit $121_1$ outputs the output signal OUT1 at the high level. The output signals $OUT_2$, $OUT_3$, . . . , $OUT_n$ of the second-stage-and-thereafter shift register unit circuits $1212$, $1213$, . . . , $121n$ are also set to the high level in the same manner as the output signal OUT1 of the first-stage shift register unit circuit $121_1$. In this way, the all-on operation when the gate start pulse signal GST is set to the high level is carried out.

As described above, the shift register 121 which is made of the shift register unit circuit 1217 according to the present embodiment outputs the output signals OUT1, OUT2, . . . OUTn at the high level as the gate signal G1, G2, . . . Gn, so that the all-on operation is carried out.

Thus, according to the seventh embodiment, the shift register may be set to undergo the all-on operation regardless of the signal level of the gate start pulse signal GST input to the set terminal SET.

Eighth Embodiment

Next, an eighth embodiment of the present invention is described.

In the present embodiment, only FIG. 1 used in the first embodiment is made use of. The display apparatus according to the eighth embodiment includes a shift register 181 shown in FIG. 16, instead of the shift register 121 shown in FIG. 2 for which use is made of in the above-described seventh embodiment. The other features are the same as the first embodiment.

Figure 16:
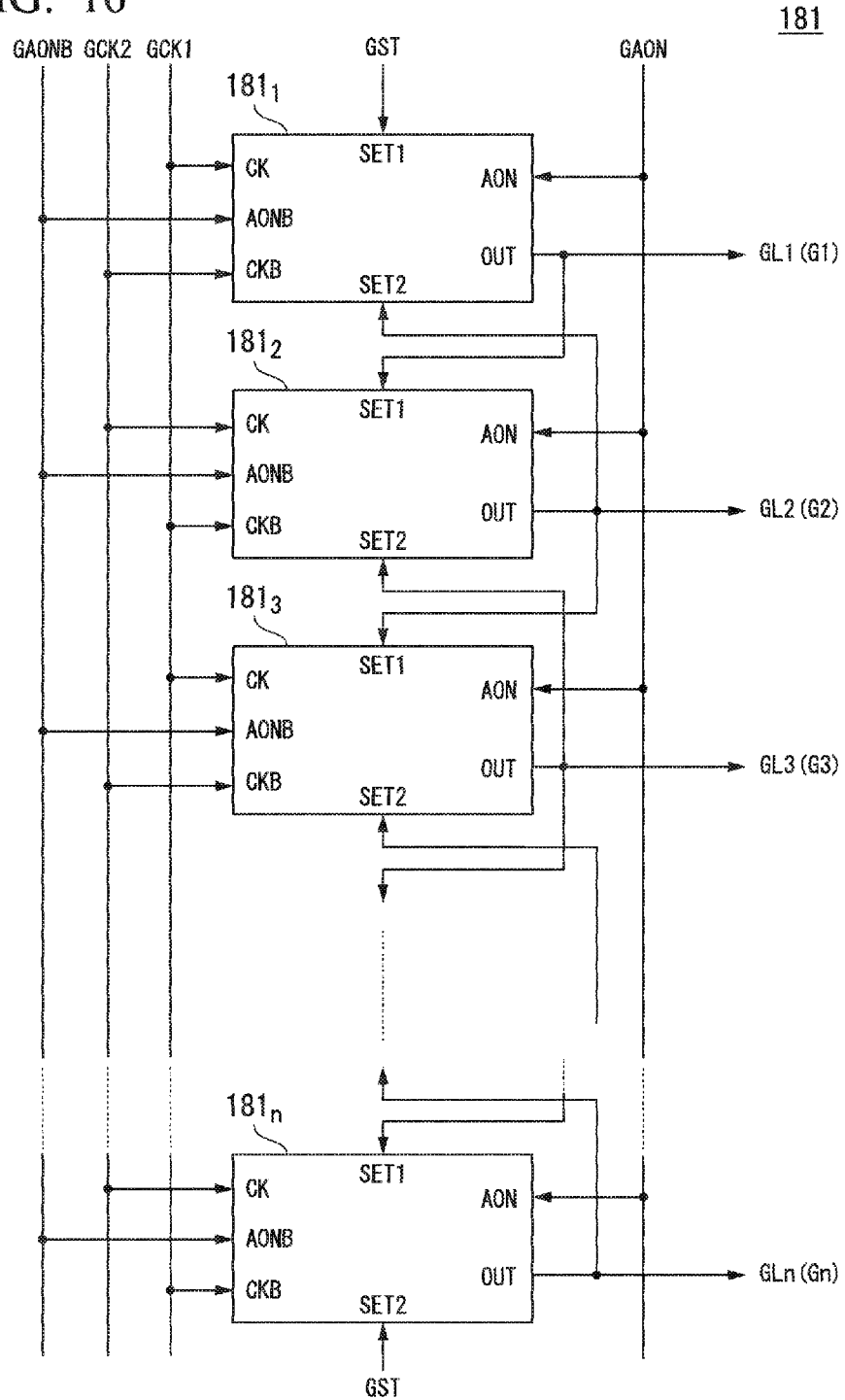
FIG. 16 is a schematic block diagram illustrating an exemplary configuration of the shift register according to an eighth embodiment.

FIG. 16 is an overview block diagram showing an exemplary configuration of the shift register 181 according to the eighth embodiment. As shown in FIG. 2, the shift register 181 includes multiple shift register unit circuits $181_1$, $181_2$, $181_3$, . . . , $181_n$ that correspond to multiple scan lines GL1, GL2, GL3, . . . , GLn. These multiple shift register unit circuits $181_1$, $181_2$, $181_3$, . . . , $181_n$ are connected in cascade.

Each of the multiple shift register unit circuits $181_1$, $181_2$, $181_3$, . . . , $181_n$ has the same configuration, so that, below, when each of the shift register unit circuits $181_1$, $181_2$, $181_3$, . . . $181_n$ is referred, it is appropriately referred to as a "shift register unit circuit 1811". The shift register unit circuit $181_1$ includes clock terminals CK and CKB; two set terminals SET1 and SET2; an output terminal OUT, and all-on control terminals AON and AONB.

A gate clock signal GCK1 is input to the clock terminal CK of the odd-numbered stage shift register unit circuit of multiple shift register unit circuits $181_1$, $181_2$, $181_3$, . . . , $181_n$, and a gate clock signal GCK2 is input to the clock terminal CKB. Conversely, the gate clock signal GCK2 is input to the clock terminal CK of the even-numbered stage shift register unit circuit and the gate clock signal GCK1 is input to the clock terminal CKB. A gate all-on control signal GAON is input to the all-on control terminal AON of the multiple shift register unit circuits $181_1$, $181_2$, $181_3$, . . . , $181_n$ and a gate all-on control Signal GAONB, which is an inverted signal of the gate all-on control signal GAON, is input to the all-on control terminal AONB.

A gate start pulse signal GST is input to the set terminal SET1 of the first-stage shift register unit circuit $181_1$ of multiple shift register unit circuits $181_1$, $181_2$, $181_3$, . . . , $181_n$, while an output signal of the pre-stage shift register unit circuit is input to the second-stage-and-thereafter shift register unit circuit (in other words, the nth-stage shift register unit from the second-stage shift register unit circuit). Moreover, the gate start pulse signal GST is input to the set terminal SET2 of the final-stage, nth-stage shift register unit circuit $181_n$, while an output signal of the post-stage shift register unit circuit is input to the set terminal SET2 of the (n−1)th-and-previous-stage shift register unit circuit (in other words, the n-lth stage shift register unit circuit from the first stage shift register unit circuit). For example, an output signal OUT1 of the pre-stage shift register unit circuit 181$_1$ thereof is input to the set terminal SET1 of the shift register unit circuit 181$_2$, while an output signal OUT3 of the post-stage shift register unit circuit 181$_3$ is input to the set terminal SET2 of the shift register unit circuit 181$_2$.

While omitted in the figures, the below-described scan switching signal UD and UDB for switching the scan direction (shift direction) is input to the individual multiple shift register unit circuits 181$_1$, 181$_2$, 181$_3$, . . . , 181$_n$.

Figure 17:
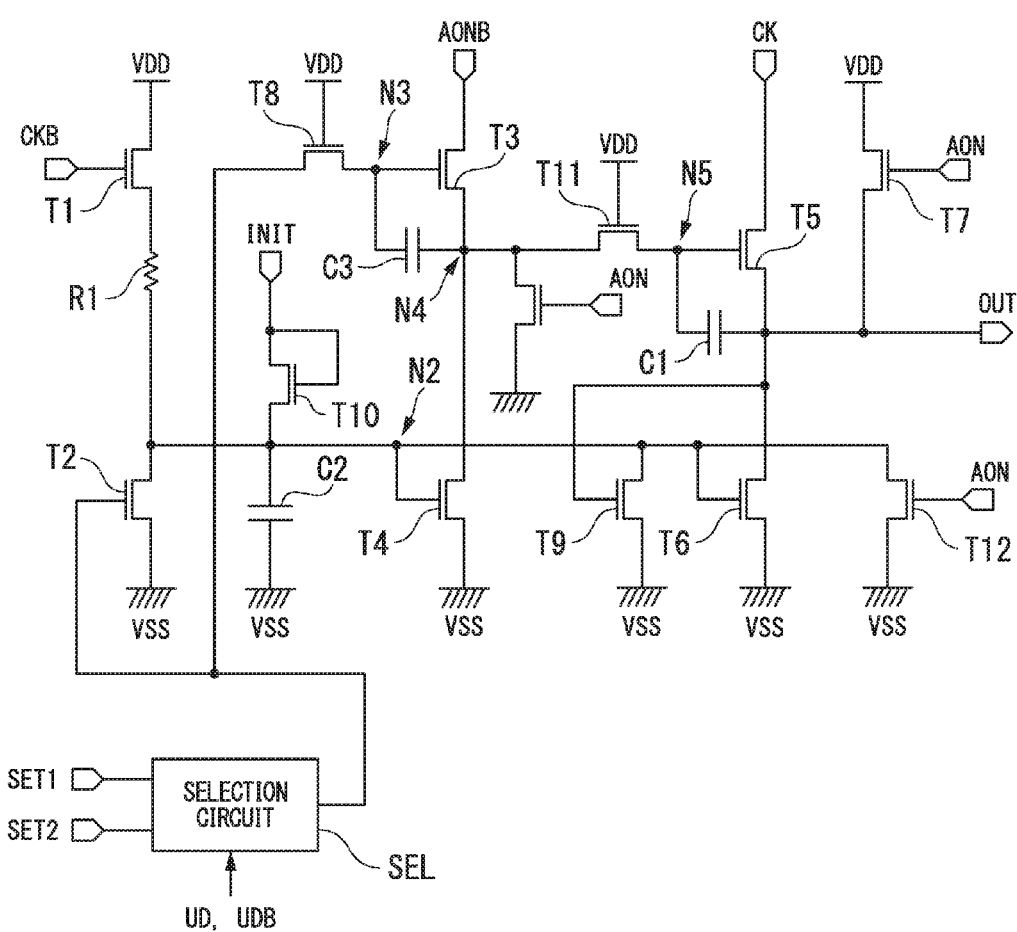
FIG. 17 is a circuit diagram illustrating an exemplary configuration of a shift register unit circuit according to the eighth embodiment.

FIG. 17 is a circuit diagram showing an exemplary configuration of the shift register unit circuit 181$_1$ according to the eighth embodiment. In the configuration of the shift register unit circuit 1217 according to the seventh embodiment shown in FIG. 15, the shift register unit circuit 181$_1$ further includes a selection circuit SEL. The other features are the same as in the shift register unit circuit 1217 of the seventh embodiment. Based on the scan switching signals UD and UDB, the selection circuit SEL selects one of an output signal of the pre-stage shift register unit circuit that is input to the set terminal SET1 (or a gate start pulse signal GST) and an output signal of the post-stage shift register unit circuit that is input to the set terminal SET2 (or the gate start pulse signal GST) to take in the selected result as an input signal.

For example, the selection circuit SEL provided in the second-stage shift register unit circuit 181$_2$ selects either of an output signal OUT1 of the first-stage shift register unit circuit 181$_1$ and an output signal OUT3 of the third-stage shift register unit circuit 181$_3$. The selection circuit SEL supplies the selected output signal to the gate of the thin film transistor T2 as well as to one end of the current path of the thin film transistor T8, which is connected to the set terminal SET according to the above-described seventh embodiment.

In the present embodiment, the selection circuit SEL functions as a scan switching circuit which switches the scan direction based on the scan switching signals UD and UDB. Here, the scan direction refers to the order of output of output signals OUT1, OUT2, OUT3, . . . , OUTn of the multiple shift register unit circuits 181$_1$, 181$_2$, 181$_3$, . . . , 181$_n$ shown in FIG. 16, where scanning in a case such that the output signals OUT1, OUT2, OUT3, . . . , OUTn are output in an ascending order scan direction from the first-stage shift register unit circuit 181$_1$ to the final-stage, n-th stage shift register unit circuit 181$_n$ is called a forward scan, while scanning in a case such that the output signals OUT1, OUT2, OUT3, . . . , OUTn are output in a descending order scan direction from the final-stage shift register unit circuit 181$_n$ to the first stage shift register unit circuit 181$_1$ is called a reverse scan.

Figure 18A:
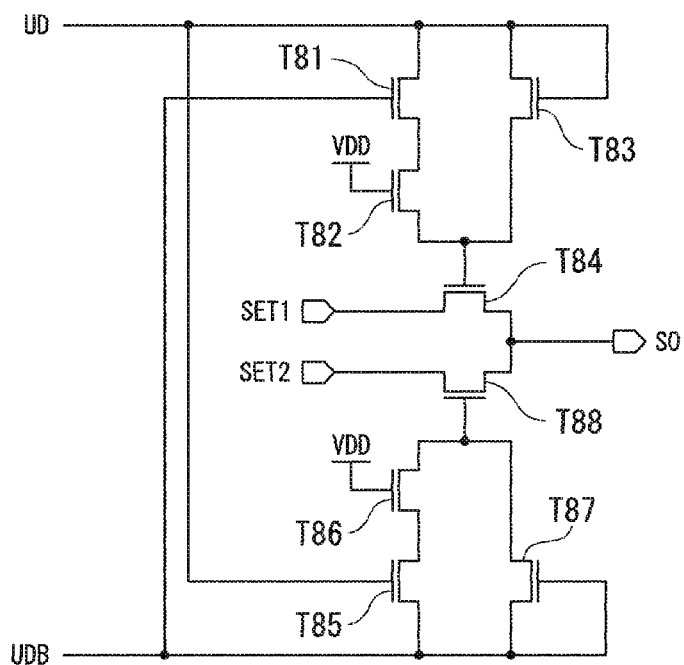
FIG. 18A is a circuit diagram illustrating a detailed example of the shift register unit circuit according to the eighth embodiment.
Figure 18B:
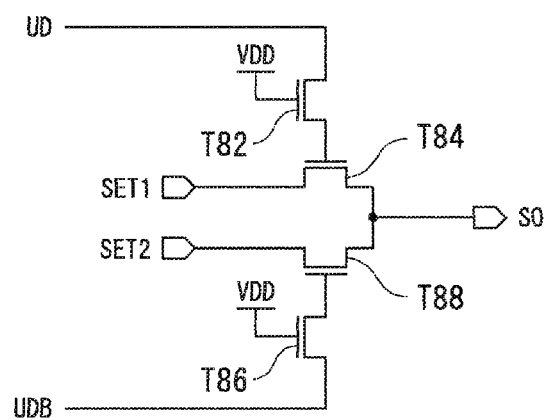
FIG. 18B is a circuit diagram illustrating a detailed example of the shift register unit circuit according to the eighth embodiment.
Figure 18C:
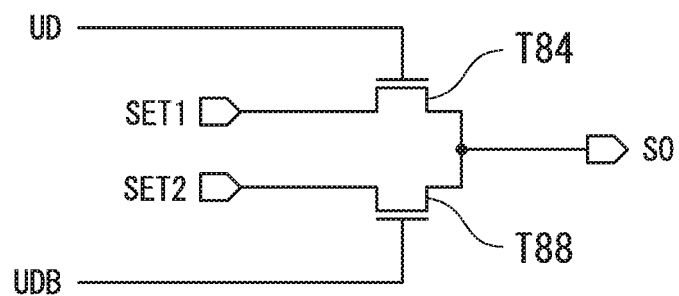
FIG. 18C is a circuit diagram illustrating a detailed example of the shift register unit circuit according to the eighth embodiment.

FIGS. 18A to 18C are circuit diagrams showing a detailed example of the shift register unit circuit according to the eighth embodiment, showing an exemplary configuration of the selection circuit SEL. The selection circuit (scanning switching circuit) shown in FIG. 18A includes thin film transistors T81, T82, T83, T84, T85, T86, T87, and T88. Here, the scan switching signal UD is supplied to the drain of the thin film transistor T81, while the scan switching signal UDB, which is an inverted signal of the scan switching signal UD, is supplied to the gate of the thin film transistor T81. The source of the thin film transistor T81 is connected to the drain of the thin film transistor T82, while the power supply voltage VDD is supplied to the gate of the thin film transistor T82. The scan switching signal UD is supplied to the drain of the thin film transistor T83 and the gate thereof is connected to the drain and the source thereof is connected to the source of the above-described thin film transistor T82 and the gate of the thin film transistor T84. In other words, the thin film transistor T83 is provided in the form of a diode connection, a scan switching signal UD is supplied to the node corresponding to the anode thereof, and the node corresponding to the cathode thereof is connected to the gate of the thin film transistor T84. One end of the current path of the thin film transistor T84 is connected to the set terminal SET1, while the other end of the current path thereof is connected to the output terminal SO.

Moreover, the scan switching signal UDB is supplied to the source of the thin film transistor T85, while the scan switching signal UD is supplied to the gate thereof. The drain of the thin film transistor T85 is connected to the source of the thin film transistor T86, and the power supply voltage VDD is supplied to the gate of the thin film transistor T86. The scan switching signal UDB is supplied to the source of the thin film T87, the gate thereof is connected to the source thereof, and the drain thereof is connected to the gate of the thin film transistor T88 and the drain of the thin film transistor T86. In other words, the thin film transistor T87 is provided in the form of a diode connection, the scan switching signal UDB is supplied to the node corresponding to the anode thereof, and the node corresponding to the cathode thereof is connected to the gate of the thin film transistor T88. One end of the current path of the thin film transistor T88 is connected to the set terminal SET2, while the other end of the current path thereof is connected to the output terminal SO.

In the above-described configuration in FIG. 18A, the selection circuit shown in FIG. 18B is configured such that the thin film transistors T81, T83, T85, and T87 are omitted, the scan switching signal UD is supplied to the drain of the thin film transistor T82, and the scan switching signal UDB is supplied to the source of the thin film transistor T86. In the above-described configuration in FIG. 18A, the selection circuit shown in FIG. 18C is configured such that the thin film transistors T81, T82, T83, T85, T86, and T87 are omitted, the scan switching signal UD is supplied to the gate of the thin film transistor T84, and the scan switching signal UDB is supplied to the gate of the thin film transistor T88.

Next, an operation of the present embodiment is described.

First a basic operation of the selection circuit SEL is described, after which an operation of the shift register unit circuit 181 shown in FIG. 16 that includes this selection circuit SEL is described.

<Operation of Selection Circuit SEL>

First, an operation of the selection circuit shown in FIG. 18A is described.

When conducting a forward scan, the scan switching signal UD is set to the high level, while the scan switching signal UDB, which is an inverted signal thereof, is set to the low level. In this case, the thin film transistor T81 to which is provided the scan switching signal UDB at the low level is brought to an off state and the gate of the thin film transistor T84 through the thin film transistor T83 whose drain is provided with the scan switching signal UD at the high level is charged to the voltage (VDD−Vth) which represents a drop by the threshold voltage Vth of the thin film transistor T83 from the power supply voltage VDD corresponding to the high level of the scan switching signal UD. Therefore, the thin film transistor T84 is turned on.

On the other hand, the thin film transistor T85 whose gate is provided with the scan switching signal UD at the high level is brought to an on state. Moreover, the thin film transistor T86 whose gate is provided with the power supply voltage VDD also takes the on state. Therefore, the gate of the thin film transistor T88 is discharged via the thin film transistor T85 and the thin film transistor T86 and the low level is applied to the gate of the thin film transistor T88. Therefore, the thin film transistor T88 is brought to an off state. In this case, the scan switching signal UDB at the low level is provided to the source and the gate of the thin film transistor T87, so that the thin film transistor T87 is brought to the off state.

As described above, when the thin film transistor T84 is turned on and the thin film transistor T88 is turned off, the set terminal SET1 is electrically connected to the output terminal SO and the set terminal SET2 is electrically disconnected from the output terminal SO. Therefore, a signal to be input to the set terminal SET1 is selected, so that the selected result is output from the output terminal SO. Here, the gate voltage of the thin film transistor T84 is pushed up by the signal level of the signal input to the set terminal SET1 by the bootstrap effect by the capacitance component between the gate and the channel of the thin film transistor T84. Therefore, a signal input to the set terminal SET1 is transmitted to the output terminal SO without causing a voltage drop by the threshold voltage Vth of the thin film transistor T84.

In this case, as an output signal of the pre-stage shift register unit circuit is input to the set terminal SET1, the multiple shift register unit circuits $181_1$, $181_2$, $181_3$, . . . , $181_n$ that are shown in FIG. 16 output the output signals $OUT_1$, $OUT_2$, $OUT_3$, . . . , $OUT_n$ in the ascending order in the same manner as the above-described individual embodiments, so that a forward scan is carried out.

Next, for carrying out the reverse scan, the scan switching signal UD is set to a low level, while the scan switching signal UDB is set to a high level. In this case, the thin film transistor T81 whose gate is provided with the scan switching signal UDB at the high level is brought to an on state. Moreover, the thin film transistor T82 whose gate is provided with the power supply voltage VDD also takes an on state. Therefore, the gate of the thin film transistor T84 is discharged through the thin film transistors T81 and T82 and a low level is applied to the gate of the thin film transistor T84. Thus, the thin film transistor T84 is brought to an off state. In this case, the thin film transistor T83 has the source and the gate supplied with the scan switching signal UDB at the low level, so that it is brought to an off state.

On the other hand, the thin film transistor T85 whose gate is provided with the scan switching signal UD at the low level is brought to an off state, and, through the thin film transistor T87 whose drain is provided the scan switching signal UDB at the high level, the gate of the thin film transistor T88 is charged to the voltage (VDD−Vth) which represents a drop by the threshold voltage Vth of the thin film transistor T87 from the power supply voltage VDD corresponding to the high level of the scan switching signal UDB. Therefore, the thin film transistor T88 is turned on.

As described above, when the thin film transistor T84 is turned off and the thin film transistor T88 is turned on, the set terminal SET2 is electrically connected to the output terminal SO and the set terminal SET1 is electrically disconnected from the output terminal SO. Thus, a signal to be input to the set terminal SET2 is selected, so that the selected result is output from the output terminal SO. Here, the gate voltage of the thin film transistor T88 is pushed up by the signal level of the signal input to the set terminal SET2 due to the bootstrap effect by the capacitance component between the gate and the channel of the thin film transistor T88. Therefore, the signal input to the set terminal SET2 is transmitted to the output terminal SO without causing a voltage drop by the threshold voltage Vth of the thin film transistor T88.

In this case, an output signal of the post-stage shift register unit circuit is input to the set terminal SET2, so that the multiple shift register unit circuits $181_1$, $181_2$, $181_3$, . . . , $181_n$ shown in FIG. 16, contrary to the above-described individual embodiments, output the output signals OUT1, OUT2, OUT3, OUTn in a descending order, so that a reverse scan is carried out.

As described above, the configuration of the selection circuit shown in FIG. 18A makes it possible to transmit a signal to the output terminal SO from the set terminal SET1 or the set terminal SET2 without causing a voltage drop due to the threshold value Vth of the thin film transistors T84 and T88. Thus, switching in the scan direction may be carried out while maintaining the operating margin of the shift register unit circuit.

Moreover, according to the configuration of the selection circuit shown in FIG. 18A, when the gate voltage of the thin film transistors T84 and T88 rise by the bootstrap effect, the thin film transistor T82 and T86 are brought to an off state, so that the source of the thin film transistors T81 and T85 whose gate is applied with the low level is not applied to the high voltage caused by the above-described bootstrap. Thus, degradation of the individual thin film transistors may be suppressed.

Next, an operation of the selection circuit shown in FIG. 18B is described.

When conducting a forward scan, the scan switching signal UD is set to the high level, while the scan switching signal UDB is set to the low level. In this case, the scan switching signal UD at the high level is transmitted to the gate of the thin film transistor T84 through the thin film transistor T82. Here, the gate of the thin film transistor T84 is charged to a voltage (VDD−Vth) which represents a drop by the threshold voltage Vth of the thin film transistor T82 from the power supply voltage VDD corresponding to the high level of the scan switching signal UD. In this way, the thin film transistor T84 is brought to an on state. On the other hand, the scan switching signal UDB at the low level is transmitted to the gate of the thin film transistor T88 via the thin film transistor T86. Here, the gate of the thin film transistor T84 is discharged to the ground voltage VSS corresponding to the low level of the scan switching signal UD. In this way, the thin film transistor T88 is brought to an off state.

Therefore, in the same manner as the selection circuit shown in the above-described FIG. 18A, the set terminal SET1 is electrically connected to the output terminal SO, so that the signal to be input to the set terminal SET1 is selected, so that the selected result is output from the output terminal SO. Moreover, by the bootstrap effect by the capacitance component between the gate and the channel of the thin film transistor T84, the signal input to the set terminal SET1 is transmitted to the output terminal SO without causing a voltage drop by the threshold voltage Vth of the thin film transistor T84.

For conducting a reverse scan, the same as a case of the forward scan is described. In this case, the thin film transistor T88 is brought to an on state, and a signal input to the set terminal SET2 is selected, so that the selected result is output from the output terminal SO.

Next, an operation of the selection circuit shown in FIG. 18C is described.

For conducting a forward scan, the scan switching signal UD is set to a high level, while the scan switching signal UDB is set to a low level. In this case, the scan switching signal UD at the high level is transmitted to the gate of the thin film transistor T84. In this way, the thin film transistor T84 is turned on. On the other hand, the scan switching signal UDB at the low level is transmitted to the gate of the thin film transistor T88. In this way, the thin film transistor T88 is turned off.

Thus, as the set terminal SET1 is electrically connected to the output terminal SO like the above-described selection circuits which are respectively shown in FIGS. 18A and 18B, a signal input to the set terminal SET1 is selected, so that the selected result is output from the output terminal SO. The selection circuit in FIG. 18C does not allow obtaining the bootstrap effect by the capacitance component between the gate and the channel of the thin film transistor T84, so that the signal level of the signal input to the set terminal SET1 is dropped by the threshold voltage Vth of the thin film transistor T84, so that the dropped result is transmitted to the output terminal SO.

In a case of conducting the reverse scan, which is described in the same manner as a case of the forward scan, the thin film transistor T88 is turned on, so that the signal input to the set terminal SET2 is selected, so that the selected result is output from the output terminal SO.

Figure 19A:
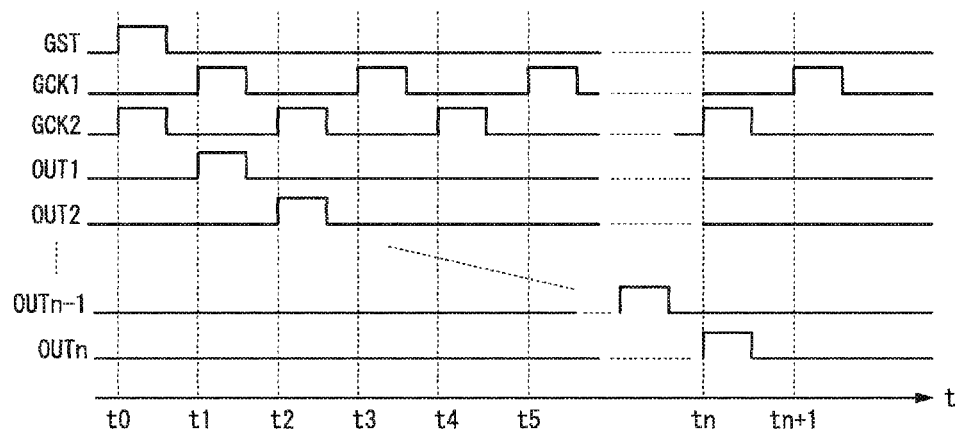
FIG. 19A is a time chart illustrating an exemplary operation of the shift register according to the eighth embodiment.
Figure 19B:
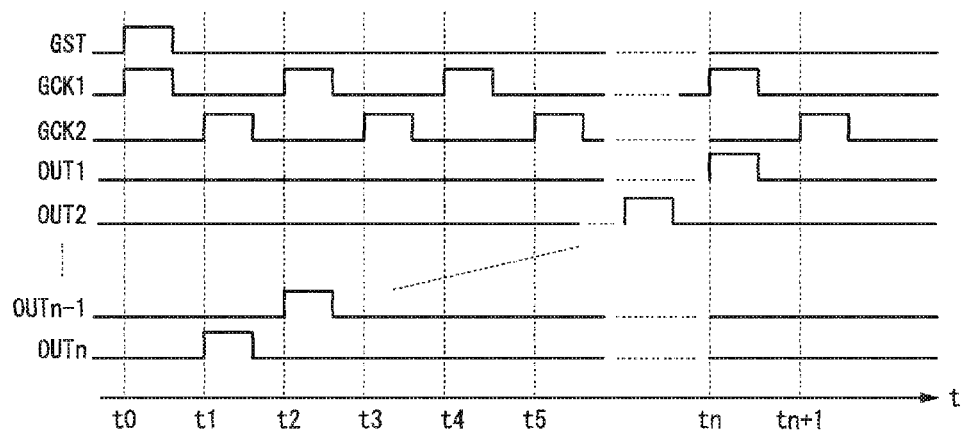
FIG. 19B is a time chart illustrating an exemplary operation of the shift register according to the eighth embodiment.

Next, an operation of the shift register unit circuit $181_1$ which includes the above-described selection circuit SEL is described with reference to FIGS. 19A and 19B. FIGS. 19A and 19B are time charts which show exemplary operations of the shift register in the eighth embodiment, where FIG. 19A is a time chart at the time of the forward scan, while FIG. 19B is a time chart at the time of the reverse scan. In FIGS. 19A and 19B, the high level and the low level of the gate start pulse signal GST, the gate clock signals GCK1 and GCK2 are respectively signal levels corresponding to the operation power supply voltage VDD supplied to the shift register and the ground voltage VSS. Moreover, in the normal operation, the gate all-on control signal GAON is set to the low level, while the gate all-on control signal GAONB is set to the high level. Moreover, in FIGS. 19A and 19B, OUT1, OUT2, OUTn-1, and OUTn respectively show the output signals of the first-stage, second-stage, (n-1)th-stage, and nth-stage shift register unit circuits $181_1$.

"H" shown indicates the high level, while "L" indicates the low level.

<Operation at the Time of Forward Scan>

For conducting a forward scan, the scan switching signal UD is set to the high level, while the scan switching signal UDB, which is the inverted signal thereof, is set to the low level. In this case, as described above, a signal to be input to the set terminal SET1 is selected by the selection circuit SEL. Therefore, a gate start pulse signal GST input to the set terminal SET1 is taken into the first-stage shift register unit circuit $181_1$, while an output of the previous-stage shift register unit circuit is taken into the set terminal SET1 of the second-stage-and-thereafter shift register unit circuits $181_2$, $181_3$, . . . , $181_n$. Therefore, as shown in FIG. 19A, in the same manner as the previously-described individual embodiments, the output signals OUT1, OUT2, OUT3, . . . , OUTn of the shift register unit circuits $181_1$, $181_2$, $181_3$, . . . , $181_n$ are output in an ascending order in synchronization with the gate clock signals GCK1 and GCK2.

<Operation at the Time of Reverse Scan>

For conducting a reverse scan, the scan switching signal UD is set to the low level, while the scan switching signal UDB, which is an inverted signal thereof, is set to the high level. In this case, as described above, a signal input to the set terminal SET2 is selected by the selection circuit SEL. Thus, a gate start pulse signal GST input to the set terminal SET2 is taken into the final stage, the n-th stage shift register unit circuit $181_1$, while an output signal of the post-stage shift register unit circuit is taken into the set terminal SET2 of the (n-1)th-stage shift register unit circuit $181_1$, $181_2$, . . . , $181_n$ from the first stage. In this case, the shift register unit circuits $181_1$, $181_2$, $181_3$, . . . , $181_n$ respectively conduct operations corresponding to the shift register unit circuits $181_n$, $181_{n-1}$, . . . , $181_2$, $181_1$ in the above-described forward scan. Thus, in this case, as shown in FIG. 19B, in inverse of the forward scan, the output signals OUT1, OUT2, OUT3, . . . , OUTn of the shift register unit circuits $181_1$, $181_2$, $181_3$, . . . , $181_n$ are output in a descending order in synchronization with the gate clock signal GK1, GK2.

<All-on Operation>

Figure 19C:
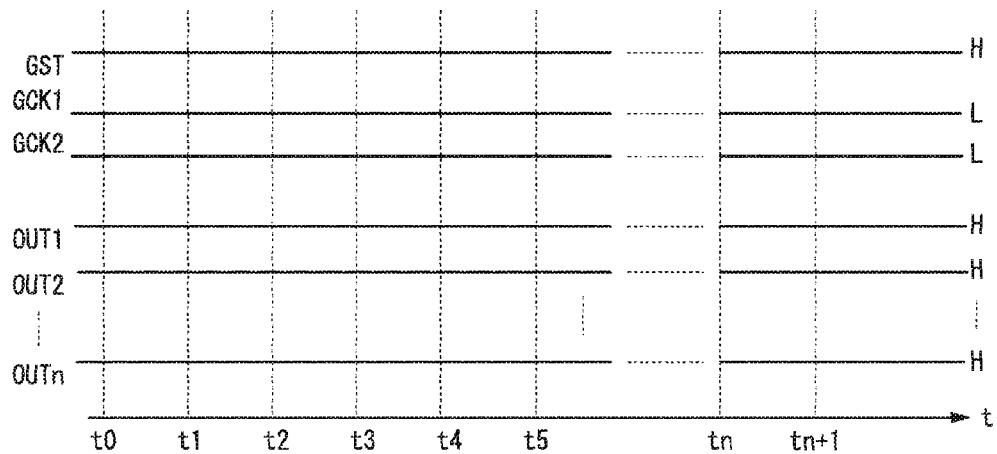
FIG. 19C is a time chart illustrating an exemplary operation of the shift register according to the eighth embodiment.

The all-on operation is the same as the above-described seventh embodiment. In other words, in this case, when the gate all-on control signal GAON is brought to the high level, all of the output signals OUT1, OUT2, OUT3, . . . , OUTn are set to the high level as shown in FIG. 19C, regardless of the signal level of the gate start pulse signal GST input to the set terminal SET1, SET2, or in other words, regardless of the selection state of the selection circuit SEL. In this way, the shift register carries out an all-on operation. As described above, the eighth embodiment makes it possible to switch the scanning direction while maintaining the operating margin.

Ninth Embodiment

Next, a ninth embodiment of the present invention is described.

Even in the present embodiment, FIGS. 1 and 2, which are used in the first embodiment, are made use of.

Figure 20:
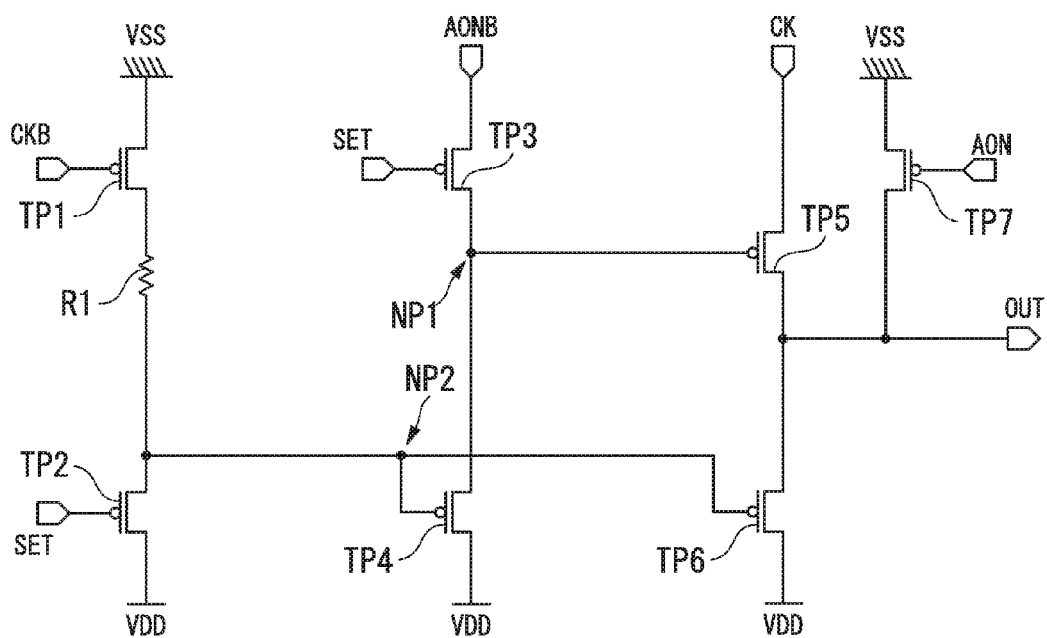
FIG. 20 is a circuit diagram illustrating an exemplary configuration of the shift register unit circuit according to a ninth embodiment.

In the above-described first embodiment, a display apparatus according to the ninth embodiment includes a shift register unit circuit 1219 shown in FIG. 20 instead of the shift register unit circuits $121_1$, $121_2$, $121_3$, . . . , $121_n$ that make up the shift register 121 shown in FIG. 2. The other features are the same as in the first embodiment.

FIG. 20 is a circuit diagram showing an exemplary configuration of the shift register unit circuit 1219 according to the ninth embodiment. The shift register unit circuit 1219 is configured such that, in the configuration of the shift register unit circuit 1211 shown in FIG. 3 that is in the above-described first embodiment, the thin film transistors T1, T2, T3, T4, T5, T6, and T7, which are n-channel field effect transistors, are respectively replaced with the thin film transistors TP1, TP2, TP3, TP4, TP5, TP6, and TP7, which are p-channel field effect transistors, and the battery voltage VDD and the ground voltage VSS are swapped. In the present embodiment, the connection point between the source of the thin film transistor TP3 and the drain of the thin film transistor TP4 forms a node NP1, while the connection point between the drain of the thin film transistor T2 and the resistance R1 forms a node NP2. Moreover, in the present embodiment, a signal input to each terminal of the set terminal SET, the clock terminals CK and CKB, and the all-on control terminals AON and AONB is brought to be an inverse of the signal input to the respective terminals according to the first embodiment.

Figure 21A:
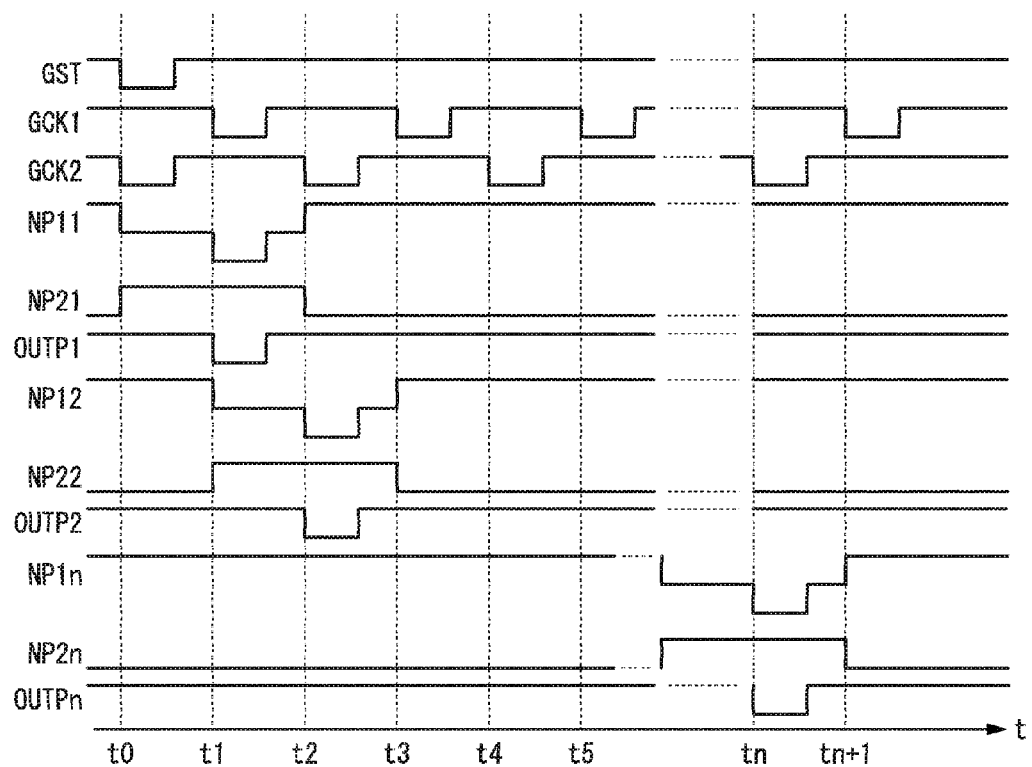
FIG. 21A is a time chart illustrating an exemplary operation of the shift register according to the ninth embodiment.
Figure 21B:
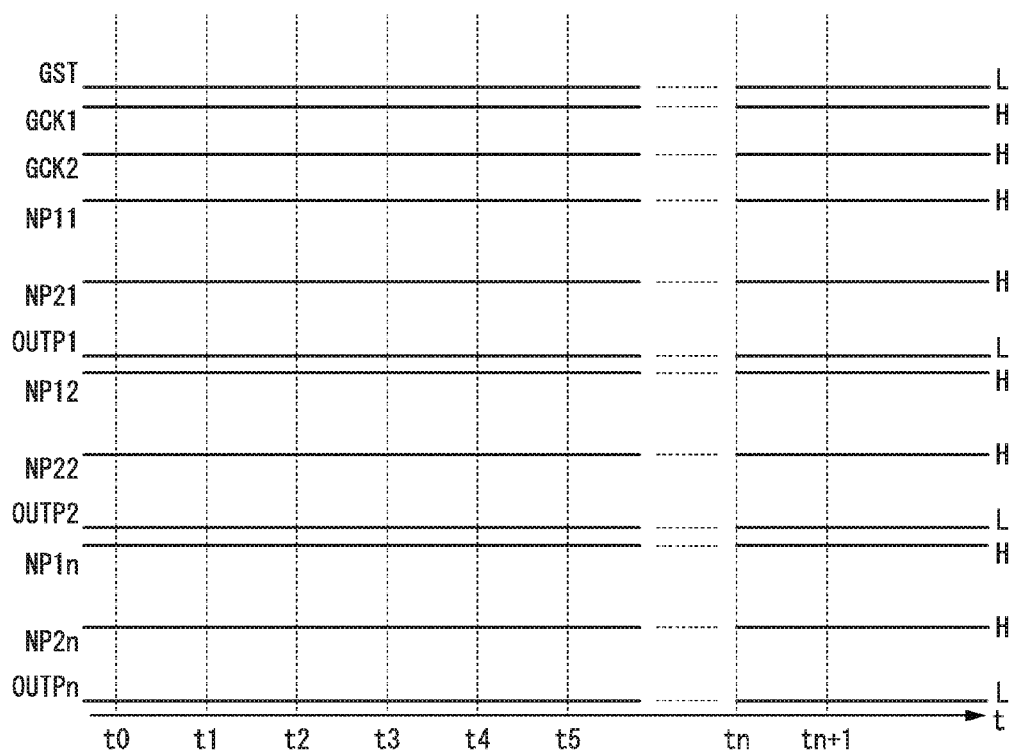
FIG. 21B is a time chart illustrating the exemplary operation of the shift register according to the ninth embodiment.
Figure 22:
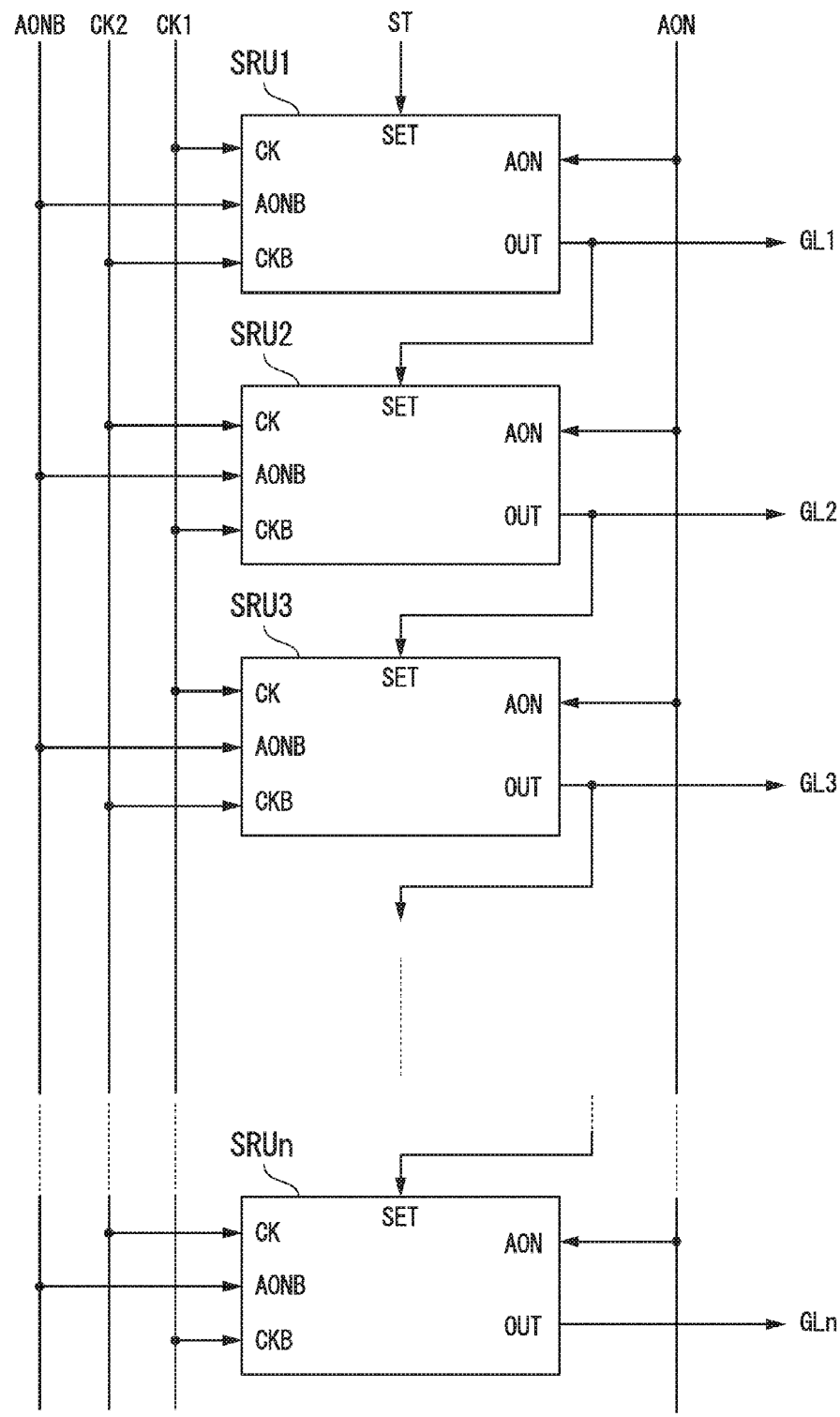
FIG. 22 is a block diagram illustrating an exemplary configuration of the shift register according to the related art.
Figure 23:
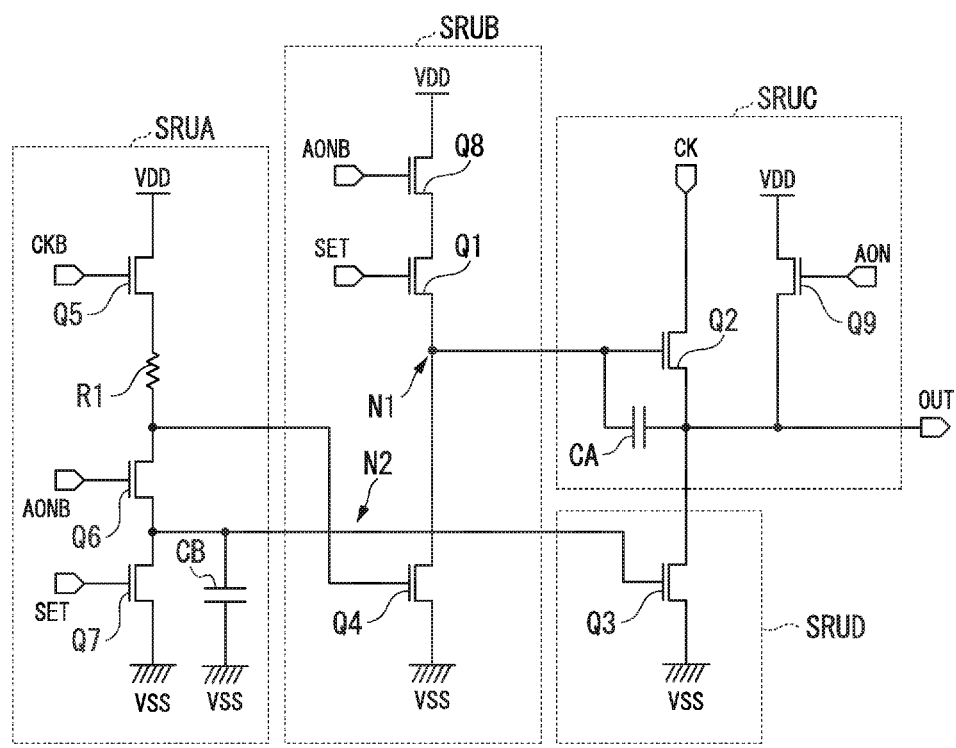
FIG. 23 is a circuit diagram illustrating an exemplary configuration of the shift register unit circuit according to the related art.
Figure 24A:
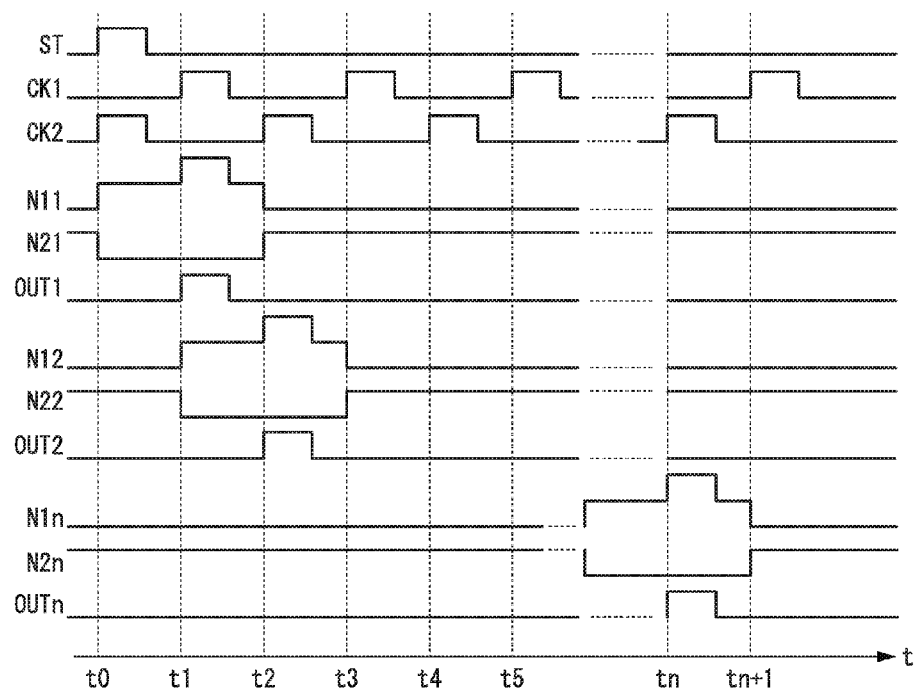
FIG. 24A is a time chart illustrating an exemplary operation of the shift register according to the related art.
Figure 24B:
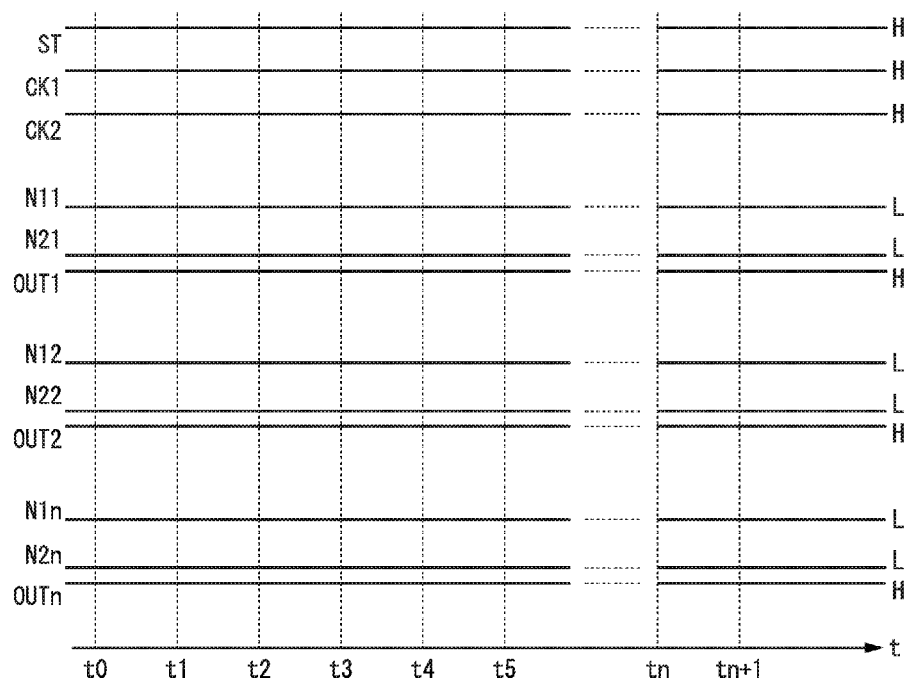
FIG. 24B is a time chart illustrating the exemplary operation of the shift register according to the related art.

FIGS. 21A and 21B are time charts showing an exemplary operation of the shift register according to the ninth embodiment, where FIG. 21A is a time chart at the time of normal operation, while FIG. 21B is a time chart at the time of the all-on operations. In FIGS. 21A and 21B, the high level and the low level of the gate start pulse signal GST, the gate clock signals GCK1 and GCK2 are respectively signal levels corresponding to the operation power supply voltage VDD supplied to the shift register and the ground voltage VSS. Moreover, for the present embodiment, in the normal operation, the gate all-on control signal GAON is set to the high level, while the gate all-on control signal GAONB is set to the low level. Conversely, in the all-on operation, the gate all-on control signal GAON is set to the low level, while the gate all-on control signal GAONB is set to a high level. Moreover, in FIGS. 21A and 21B, NP11 and NP21 refer to the nodes NP1 and NP2 of the first-stage shift register unit circuit $121_1$, NP12 and NP22 refer to nodes NP1 and NP2 of the second-stage shift register unit circuit $121_2$, NP1n and NP2n refer to nodes NP1 and NP2 of the nth-stage shift register unit circuit $121_n$, and OUTP1, OUTP2, and OUTPn show an output signal of the first-stage, second-stage, and n-th shift register unit circuit 1219.

"H" shown indicates a high level, while "L" shows a low levl.

The operation of the shift register unit circuit 1219 is described in the same manner as the first embodiment by basically inverting the individual signal levels in the operation of the shift register unit circuit 1211 in the above-described first embodiment. In the present embodiment, as shown in FIG. 21A, the respective output signals OUTP1, OUTP2, OUTP3, . . . , OUTPn of the multiple shift register unit circuits 1211, 1212, 1213, . . . , 121n are brought to be low-level pulse signals and are maintained at the low level in the normal operation.

Here, a p-channel field effect transistor may be used as a thin film transistor for pixels TC of the pixel unit PIX to bring the respective output signals OUTP1, OUTP2, OUTP3, . . . , OUTPn of multiple shift registers 1211, 1212, 1213, . . . , 121n to be at the low level in the all-on operation to bring the thin film transistor for pixels TC of all of the pixel units PIXs into conduction. Moreover, in the same manner as the first embodiment, when using a n-channel field effect transistor as the thin film transistor for pixels TC of the pixel unit PIX, to bring the thin film transistor TC for pixels of all of the pixel units PIXs to conduction in the all-on operation, the gate signals G1, G2, . . . , Gn on the scan lines GL1, GL2, . . . , GLn need to be set to the high level. Therefore, in this case, for example, an inverter circuit for inverting the signal level of the output signals OUTP1, OUTP2, OUTP3, . . . , OUTPn of the shift register unit circuit 1219 may be provided.

According to the present embodiment, a p-channel field effect transistor as a thin film transistor which makes up the shift register unit circuit 1219 may be used to configure the shift register which enables the normal operation and the all-on operation without increasing the number of transistors.

While the individual thin film transistors of the shift register unit circuit 1211 in the above-described first embodiment is replaced with the p-channel field effect transistor to configure the shift register unit circuit 1219, the individual shift register unit circuits in the second to the eighth embodiments may also be replaced with the p-channel field effect transistor in a similar manner.

While embodiments of the present invention have been described in the foregoing, the characteristic portions specific to each embodiment of the above-described first to ninth embodiments may be combined arbitrarily and the same applies also to the above-described variations. Moreover, the present invention is not limited to the above-described embodiments, so that various variations, changes, and replacements are possible without departing from the gist of the present invention.

For example, in the above-described respective embodiments, the individual thin film transistors may be provided as multiple thin film transistors whose gate is common and whose current paths (the source and the drain) are connected in series or in parallel.

INDUSTRIAL APPLICABILITY

The present invention may be applied to liquid crystal televisions, etc.

DESCRIPTION OF REFERENCE NUMERALS 100 display apparatus
110 display unit
120 scan line drive circuit (gate driver)
121 shift register
$121_1$-$121_n$ shift register unit circuit
130 signal line drive circuit (source driver)
131 shift register
140 display control circuit
150 power supply circuit
120 scan line drive circuit
121 shift register
131 shift register
140 display control circuit
$181_1$-$181_n$ shift register unit circuit
C1, C2, C3 capacitor
CS pixel capacitance unit
GL1-GLn scan line
PIX pixel unit
R1 resistance
SEL selection circuit
SL1-SLm signal line
T1-T12, T81-T88 thin film transistor
Tcom opposing electrode
TP1-TP7 thin film transistor
TS1-TSm thin film transistor for signal line selection

The invention claimed is:

1. A shift register in which a unit circuit in a plurality are connected in cascade, wherein the unit circuit includes
a first output transistor whose current path is connected between an output terminal and a clock terminal to which a first clock signal is provided;
a second output transistor whose current path is connected between the output terminal and a predetermined potential node;
a setting device which, when a control signal for setting a signal level of an output signal of the plurality of unit circuits to a predetermined signal level is active, sets a signal level of the output terminal to the predetermined signal level;
a first output control device which provides a signal level of the control signal to a control electrode of the first output transistor to turn off the first output transistor when the control signal is active and responds to an input signal to turn on the first output transistor when the control signal is non-active; and
a second output control device which turns off the second output transistor when the control signal is active and which, when the control signal is non-active, responds to a second clock signal following the first clock signal, or a signal synchronized with the first clock signal to turn off the first output transistor and also turns on the second output transistor; wherein the first output control device includes a first field effect transistor whose current path is connected between a control signal terminal to which the control signal is provided and a control electrode of the first output transistor and whose gate is provided with the input signal.

2. The shift register as claimed in claim 1, wherein the first output control device further includes a second field effect transistor whose current path is inserted between an input terminal to which the input signal is provided and the gate of the first field effect transistor and whose gate is provided with a predetermined potential.

3. The shift register as claimed in claim 2, wherein the first output transistor is a field effect transistor, the shift register further including
   a first capacitor which is connected between the drain and the gate of the first output transistor; and
   a second capacitor which is connected between the drain and the gate of the first field effect transistor.

4. The shift register as claimed in claim 3, wherein the second output transistor is a field effect transistor, the shift register further including a third field effect transistor whose gate is connected to the drain of the second output transistor and whose drain is connected to the gate of the second output transistor.

5. The shift register as claimed in claim 4, further comprising a fourth field effect transistor whose source is connected to the gate of the second output transistor and to which gate and drain is applied an initialization signal.

6. The shift register as claimed in claim 5, further comprising a fifth field effect transistor whose current path is inserted between the source of the first field effect transistor and the gate of the first output transistor.

7. The shift register as claimed in claim 6, further comprising:
   a sixth field effect transistor whose current path is connected between the gate of the second output transistor and the predetermined potential node and whose gate is provided with the control signal; and
   a seventh field effect transistor whose current path is connected between the source of the first field effect transistor and the predetermined potential node and whose gate is provided with the control signal.

8. The shift register as claimed in claim 1, wherein each of the plurality of unit circuits further includes
   a selection circuit which selects one of an output signal of a pre-stage unit circuit and an output signal of a post-stage unit circuit to take in the selected result as the input signal.

9. The shift register as claimed in claim 7, wherein the first output transistor, the second output transistor, the first field effect transistor, the second field effect transistor, the third field effect transistor, the fourth field effect transistor, the fifth field effect transistor, the sixth field effect transistor, and the seventh field effect transistor are field effect transistors of the same conduction type, and are n-channel or n-channel field effect transistors.

10. A display apparatus comprising a drive circuit which includes the shift register as claimed in claim 1.

* * * * *